United States Patent
Kinoshita

(10) Patent No.: US 11,569,376 B2
(45) Date of Patent: Jan. 31, 2023

(54) SILICON CARBIDE SEMICONDUCTOR DEVICE AND METHOD OF MANUFACTURING SILICON CARBIDE SEMICONDUCTOR DEVICE

(71) Applicant: FUJI ELECTRIC CO., LTD., Kawasaki (JP)

(72) Inventor: Akimasa Kinoshita, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 16/983,558

(22) Filed: Aug. 3, 2020

(65) Prior Publication Data

US 2021/0074849 A1    Mar. 11, 2021

(30) Foreign Application Priority Data

Sep. 6, 2019 (JP) .............................. JP2019-163386

(51) Int. Cl.
| | |
|---|---|
| H01L 29/78 | (2006.01) |
| H01L 29/16 | (2006.01) |
| H01L 21/04 | (2006.01) |
| H01L 29/66 | (2006.01) |
| H01L 29/10 | (2006.01) |

(52) U.S. Cl.
CPC ...... *H01L 29/7813* (2013.01); *H01L 21/0465* (2013.01); *H01L 29/1095* (2013.01); *H01L 29/1608* (2013.01); *H01L 29/66068* (2013.01)

(58) Field of Classification Search
CPC ............. H01L 29/7813; H01L 29/1608; H01L 29/0623
See application file for complete search history.

(56) References Cited

U.S. PATENT DOCUMENTS

| | | | |
|---|---|---|---|
| 2017/0221714 A1* | 8/2017 | Wakimoto | ............ H01L 21/046 |
| 2018/0033876 A1 | 2/2018 | Sugahara et al. | |
| 2018/0138264 A1* | 5/2018 | Kinoshita | ........... H01L 29/1095 |
| 2018/0197983 A1* | 7/2018 | Kinoshita | ............... H01L 29/06 |

FOREIGN PATENT DOCUMENTS

| | | |
|---|---|---|
| JP | 6115678 B1 | 4/2017 |
| JP | 2017-139499 A | 8/2017 |
| JP | 2018-019046 A | 2/2018 |
| WO | 2017/064949 A1 | 4/2017 |

* cited by examiner

Primary Examiner — Samuel A Gebremariam
Assistant Examiner — Jonas T Beardsley

(57) ABSTRACT

First $p^+$-type regions are provided directly beneath trenches, separate from a p-type base region and facing bottoms of the trenches in a depth direction. The first $p^+$-type regions are exposed at the bottoms of the trenches and are in contact with a gate insulating film at the bottoms of the trenches. Second $p^+$-type regions are each provided between (mesa region) adjacent trenches, separate from the first $p^+$-type regions and the trenches. Drain-side edges of the second $p^+$-type regions are positioned closer to a source side than are drain-side edges of the first $p^+$-type regions. In each mesa region, an $n^+$-type region is provided separate from the first $p^+$-type regions and the trenches. The $n^+$-type regions are adjacent to and face the second $p^+$-type regions in the depth direction.

8 Claims, 14 Drawing Sheets

SILICON CARBIDE SEMICONDUCTOR DEVICE AND METHOD OF MANUFACTURING SILICON CARBIDE SEMICONDUCTOR DEVICE

CROSS REFERENCE TO RELATED APPLICATIONS

This application is based upon and claims the benefit of priority of the prior Japanese Patent Application No. 2019-163386, filed on Sep. 6, 2019, the entire contents of which are incorporated herein by reference.

BACKGROUND

1. Field

Embodiments discussed herein are related to a silicon carbide semiconductor device and a method of manufacturing a silicon carbide semiconductor device.

2. Description of Related Art

Among trench-gate-type metal oxide semiconductor field effect transistors (MOSFETs) that contain silicon carbide (SiC) and include insulated gates having a three-layered structure including a metal, an oxide film, and a semiconductor, a conventional device has been proposed that realizes high breakdown voltage and low ON resistance by forming, by a combination of epitaxial growth and ion implantation, semiconductor regions that configure a front element structure of a front side of a substrate (for example, refer to International Publication No. WO 2017/064949, Japanese Laid-Open Patent Publication No. 2017-139499, Japanese Patent No. 6115678 and Japanese Laid-Open Patent Publication No. 2018-019046).

In International Publication No. WO 2017/064949, Japanese Laid-Open Patent Publication No. 2017-139499, Japanese Patent No. 6115678 and Japanese Laid-Open Patent Publication No. 2018-019046, in an $n^-$-type drift region, at a positions closer to an $n^+$-type drain region than are trench bottoms, first $p^+$-type regions facing the trench bottoms in a depth direction and second $p^+$-type regions adjacent to and facing a p-type base region in the depth direction are formed, whereby application of high electric field to the trench bottoms is prevented, thereby realizing high breakdown voltage and high reliability. Further, an n-type impurity concentration of a junction FET (JFET) sandwiched between the first and the second $p^+$-type regions is set to be higher than that of the $n^-$-type drift region, thereby lowering the ON resistance.

Further, the p-type base region is formed by an epitaxial layer having favorable crystallinity and interface state density of an interface between a gate insulating film and SiC is reduced, whereby carrier mobility of a channel (n-type inversion layer) is increased and the ON resistance is reduced. In Japanese Laid-Open Patent Publication No. 2018-019046, by $n^+$-type regions provided directly beneath (drain side) the second $p^+$-type regions, an n-type impurity concentration of parts directly beneath the first $p^+$-type regions is set lower than an n-type impurity concentration of parts directly beneath the second $p^+$-type regions, whereby the breakdown voltage near the trench bottoms becomes higher than a breakdown voltage between trenches and reliability is further enhanced.

A cross-section of a structure of a conventional silicon carbide semiconductor device will be described. FIG. 13 is a cross-sectional view of the structure of the conventional silicon carbide semiconductor device. FIG. 13 corresponds to FIG. 1 of Japanese Laid-Open Patent Publication No. 2018-019046. A conventional silicon carbide semiconductor device 110 depicted in FIG. 13 is a trench gate MOSFET that includes, in an $n^-$-type drift region 102, first and second $p^+$-type regions 121, 122 provided at depth positions closer to an $n^+$-type drain region 101 than are bottoms of trenches 107, and $n^+$-type regions 123 provided directly beneath the second $p^+$-type regions 122.

The first $p^+$-type regions 121 are provided directly beneath (drain side) the trenches 107, separate from a p-type base region 104 and facing bottoms of the trenches 107 in the depth direction. The second $p^+$-type regions 122 are each provided between (mesa region) a pair of adjacent trenches 107 among the trenches 107, separate from the first $p^+$-type regions 121 and the trenches 107, and adjacent to and facing the p-type base region 104 in the depth direction. Drain-side edges of the first and the second $p^+$-type regions 121, 122 are positioned at a same depth. In the mesa regions, the $n^+$-type regions 123 are provided separate from the first $p^+$-type regions 121 and the trenches 107, and adjacent to the second $p^+$-type regions 122 in the depth direction.

The $n^+$-type regions 123 are positioned closer to the drain side in the depth direction than are the first and the second $p^+$-type regions 121, 122. The first and the second $p^+$-type regions 121, 122 and the $n^+$-type regions 123 are diffusion regions formed by ion implantation. The first and the second $p^+$-type regions 121, 122 and the $n^+$-type regions 123 have a function of mitigating electric field applied to the bottoms of the trenches 107. Reference numeral 103 represents n-type regions that form a current spreading layer (CSL) that reduces carrier spreading resistance.

Reference numerals 104, 105, 106, 108, 109, and 111 are the p-type base region, $n^+$-type source regions, $p^{++}$-type contact regions, a gate insulating film, gate electrodes, and an insulating film, respectively. Reference numerals 112, 113 are metal films configuring a source electrode and reference numeral 114 is a drain electrode. Reference numerals 131, 132, and 133 are respectively an $n^+$-type starting substrate configuring a semiconductor substrate 130, an $n^-$-type epitaxial layer, and a p-type epitaxial layer that respectively configure the $n^+$-type drain region 101, the $n^-$-type drift region 102, and the p-type base region 104.

Next, a method of manufacturing the conventional silicon carbide semiconductor device 110 will be described. FIG. 14 is a flowchart of an outline of the method of manufacturing the conventional silicon carbide semiconductor device. FIGS. 15, 16, 17, 18, 19, and 20 are cross-sectional views depicting states of the conventional silicon carbide semiconductor device during manufacture. On the $n^+$-type starting substrate 131 that becomes the $n^+$-type drain region 101, of the $n^-$-type epitaxial layer 132, a part ($n^-$-type epitaxial layer) 132a contributing to a thickness of the $n^-$-type epitaxial layer 132 from the $n^+$-type drain region 101 to source-side edges of the first $p^+$-type regions 121 is deposited (formed) (step S101).

Next, at the surface of the $n^-$-type epitaxial layer 132a, a first ion implantation mask 141 opened at parts corresponding to formation regions of the first and the second $p^+$-type regions 121, 122 is formed (step S102). Next, a first ion implantation 142 of a p-type impurity is performed using the first ion implantation mask 141 as a mask (step S103). In the process at step S103, the first $p^+$-type regions 121 and $p^+$-type regions 122a that are parts of the second $p^+$-type regions 122 are selectively formed at surface regions of the $n^-$-type epitaxial layer 132a (FIG. 15).

Next, on the first ion implantation mask 141, a second ion implantation mask 143 opened at parts corresponding to formation regions of the n+-type regions 123 is formed (step S104). In the process at step S104, the second ion implantation mask 143 is formed covering the first p+-type regions 121 exposed in the openings of the first ion implantation mask 141 used in the process at step S103. Next, a second ion implantation 144 of an n-type impurity is performed using the first and the second ion implantation masks 141, 143 as a mask (step S105).

In the process at step S105, at surface regions of the n−-type epitaxial layer 132a, the n+-type regions 123 are formed adjacent to the second p+-type regions 122 in the depth direction at positions deeper than are the second p+-type regions 122. The first ion implantation mask 141 used to form the second p+-type regions 122 is used as is to perform the second ion implantation 144 and therefore, the n+-type regions 123 are formed directly beneath the second p+-type regions 122 with positioning accuracy (FIG. 16). Subsequently, the first and the second ion implantation masks 141, 143 are removed.

Next, a third ion implantation mask (not depicted) opened at parts corresponding to formation regions of n-type regions (hereinafter, n-type current spreading regions) 103 that become the current spreading layer is formed (step S106). Next, a third ion implantation 145 of an n-type impurity is performed using the third ion implantation mask as a mask (step S107). In the process at step S107, n-type regions 103a that are parts of the n-type current spreading regions 103 are formed between the first and the second p+-type regions 121, 122 (FIG. 17). Subsequently, the third ion implantation mask is removed.

Next, of the n−-type epitaxial layer 132, a part (n−-type epitaxial layer) 132b contributing to a remaining thickness of the n−-type epitaxial layer 132 from the source-side edges the first p+-type regions 121 to the p-type base region 104 is deposited (step S108). By the process at step S108, the n−-type epitaxial layer 132 is formed having a predetermined thickness between the n+-type drain region 101 and the p-type base region 104 (FIG. 18). Next, at the surface of the n−-type epitaxial layer 132b, a fourth ion implantation mask 146 opened at parts corresponding to the second p+-type regions 122 is formed (step S109).

Next, a fourth ion implantation 147 of a p-type impurity is performed using the fourth ion implantation mask 146 as a mask (step S110). In the process at step S110, p+-type regions 122b are selectively formed penetrating through the n−-type epitaxial layer 132b in the depth direction and reaching the p+-type regions 122a below. These p+-type regions 122a, 122b that are adjacent to one another in the depth direction are connected, thereby forming the second p+-type regions 122 (FIG. 19). Next, the fourth ion implantation mask 146 is removed.

Next, a fifth ion implantation mask (not depicted) opened at parts corresponding to formation region of the n-type current spreading regions 103 is formed (step S111). Next, a fifth ion implantation of an n-type impurity is performed using the fifth ion implantation mask as a mask (step S112, not depicted). In the process at step S112, between the second p+-type regions 122 that are adjacent to each other, n-type regions 103b reaching the n-type regions 103a below are formed, thereby connecting the n-type regions 103a, 103b that are adjacent to one another in the depth direction, whereby the n-type current spreading regions 103 are formed. Next, the fifth ion implantation mask is removed.

Next, at the surface of the n−-type epitaxial layer 132b, a p-type epitaxial layer 133 that becomes the p-type base region 104 is deposited, whereby the semiconductor substrate (semiconductor wafer) 130 is formed (step S113, FIG. 20). Next, after a MOS gate structure and remaining parts such as the metal films 112, 113, the drain electrode 114 (refer to FIG. 13) are formed (including a heat treatment for impurity diffusion) (step S114), the semiconductor substrate 130 is separated into individual chips, whereby the conventional silicon carbide semiconductor device 110 is completed.

SUMMARY

According to an embodiment a silicon carbide semiconductor device includes a semiconductor substrate containing silicon carbide, having a first main surface and a second main surface opposite to each other; a first semiconductor region of the first conductivity type, provided in the semiconductor substrate; a second semiconductor region of a second conductivity type, provided between the first main surface of the semiconductor substrate and the first semiconductor region; a plurality of third semiconductor regions of the first conductivity type, selectively provided between the first main surface of the semiconductor substrate and the second semiconductor region; a plurality of fourth semiconductor regions of the first conductivity type, provided between the first semiconductor region and the second semiconductor region and having an impurity concentration higher than an impurity concentration of the first semiconductor region; a plurality of trenches each penetrating a corresponding third semiconductor region of the plurality of third semiconductor regions and the second semiconductor region, and reaching the plurality of fourth semiconductor regions; a plurality of gate electrodes each provided in a corresponding one of the plurality of trenches via a gate insulating film; a fifth semiconductor region of the first conductivity type, provided between the second main surface of the semiconductor substrate and the first semiconductor region, the fifth semiconductor region having an impurity concentration higher than the impurity concentration of the first semiconductor region; a plurality of first second-conductivity-type high-concentration regions of the second conductivity type, selectively provided at positions closer to the second main surface than are bottoms of the plurality of trenches, separate from the second semiconductor region and facing the plurality of trenches, respectively, in a depth direction, the plurality of first second-conductivity-type high-concentration regions having an impurity concentration higher than an impurity concentration of the second semiconductor region; a plurality of second second-conductivity-type high-concentration regions of the second conductivity type, selectively provided at positions closer to the first main surface than is the plurality of first second-conductivity-type high-concentration regions, separate from the plurality of trenches and the plurality of first second-conductivity-type high-concentration regions, the plurality of second second-conductivity-type high-concentration regions being in contact with the second semiconductor region and having an impurity concentration higher than the impurity concentration of the second semiconductor region; a first electrode electrically connected to the second semiconductor region and the third semiconductor regions; and a second electrode electrically connected to the fifth semiconductor region. Each of the plurality of first second-conductivity-type high-concentration regions has a first edge that faces the second main surface and each of the plurality of second second-conductivity-type high-concentration regions has a second edge that faces the second main surface and that is positioned closer to the first main surface than is the first edge of the each of the plurality of first second-conductivity-type high-concentration regions.

In the embodiment, the impurity concentration of the plurality of first second-conductivity-type high-concentration regions decreases with increasing distance from a concentration peak position, toward the first main surface and the second main surface along the depth direction, the concentration peak position indicating a maximum value of the impurity concentration. The second edge of the each of the plurality of second second-conductivity-type high-concentration regions is positioned closer to the first main surface than is the concentration peak position of the plurality of first second-conductivity-type high-concentration regions.

In the embodiment, the second edge of the each of the plurality of second second-conductivity-type high-concentration regions has a curved shape protruding toward the second main surface.

In the embodiment, the silicon carbide semiconductor device further includes a plurality of first-conductivity-type high-concentration regions of the first conductivity type, selectively provided in the fourth semiconductor regions, separate from the plurality of trenches and the plurality of first second-conductivity-type high-concentration regions, at positions closer to the second main surface than is the plurality of second second-conductivity-type high-concentration regions in the depth direction, the plurality of first-conductivity-type high-concentration regions facing and being in contact with the plurality of second second-conductivity-type high-concentration regions in the depth direction, and having an impurity concentration higher than the impurity concentration of the first semiconductor region.

In the embodiment, the each of the plurality of first second-conductivity-type high-concentration regions has a third edge facing the first main surface, and the second edge of the each of the plurality of second second-conductivity-type high-concentration regions is positioned closer to the first main surface than is the third edge of the each of the plurality of first second-conductivity-type high-concentration regions.

In the embodiment, the second edge of the each of the plurality of second second-conductivity-type high-concentration regions is a flat surface parallel to the second main surface.

In the embodiment, the each of the plurality of first second-conductivity-type high-concentration regions has a third edge facing the first main surface and a distance from the second edge of the each of the plurality of second second-conductivity-type high-concentration regions to the first edge of the each of the plurality of first second-conductivity-type high-concentration regions is at least a distance from the second semiconductor region to the third edge of the each of the plurality of first second-conductivity-type high-concentration regions in the depth direction.

In the embodiment, a distance from one of the plurality of first second-conductivity-type high-concentration regions to an adjacent one of the plurality of second second-conductivity-type high-concentration regions in a direction parallel to the first main surface is at most 1.1 µm.

According to another embodiment, a method of manufacturing a silicon carbide semiconductor device, includes depositing a first semiconductor layer of a first conductivity type, on a starting substrate of the first conductivity type and containing silicon carbide, the first semiconductor layer having an impurity concentration lower than an impurity concentration of the starting substrate; selectively forming a plurality of first second-conductivity-type high-concentration regions of a second conductivity type, at surface regions of the first semiconductor layer by a first ion implantation; selectively forming a plurality of first first-conductivity-type regions of the first conductivity type, at surface regions of the first semiconductor layer by a second ion implantation, the plurality of first first-conductivity-type regions faces the plurality of first second-conductivity-type high-concentration regions in a direction parallel to a surface of the first semiconductor layer and has an impurity concentration higher than the impurity concentration of the first semiconductor layer; depositing a second semiconductor layer of the first conductivity type, on the first semiconductor layer, the second semiconductor layer containing silicon carbide and having an impurity concentration lower than the impurity concentration of the starting substrate; forming, on the second semiconductor layer, an ion implantation mask opened at parts corresponding to the plurality of first first-conductivity-type regions in a depth direction; selectively forming a plurality of second second-conductivity-type high-concentration regions of the second conductivity type, at surface regions of the second semiconductor layer by performing a third ion implantation using the ion implantation mask as a mask, the plurality of second second-conductivity-type high-concentration regions being separate from the plurality of first second-conductivity-type high-concentration regions; removing the ion implantation mask; selectively forming a plurality of second first-conductivity-type regions of the first conductivity type, at surface regions of the second semiconductor layer by a fifth ion implantation, the plurality of second first-conductivity-type regions facing the plurality of second second-conductivity-type high-concentration regions in the direction parallel to a surface of the second semiconductor layer and in contact with the plurality of first first-conductivity-type regions in the depth direction, the plurality of second first-conductivity-type regions having an impurity concentration higher than the impurity concentration of the second semiconductor layer; depositing a third semiconductor layer of the second conductivity type on the second semiconductor layer, the third semiconductor layer containing silicon carbide; and forming an insulated gate structure including a plurality of trenches each penetrating the second semiconductor layer and reaching a corresponding one of the plurality of first second-conductivity-type high-concentration regions, and a plurality of gate electrodes each provided in a corresponding one of the plurality of trenches via a gate insulating film. Each of the plurality of first second-conductivity-type high-concentration regions has a first lower edge, and each of the plurality of second second-conductivity-type high-concentration regions has a second lower edge at a position shallower than the first lower edge of the each of the plurality of first second-conductivity-type high-concentration regions.

In the embodiment, the each of the plurality of first second-conductivity-type high-concentration regions has a concentration peak position, and the each of the plurality of second second-conductivity-type high-concentration regions is formed having the second lower edge at a position shallower than the concentration peak position.

In the embodiment, the method further includes forming a plurality of first-conductivity-type high-concentration regions of the first conductivity type by performing a fourth ion implantation using the ion implantation mask as a mask after forming the ion implantation mask but before removing the ion implantation mask, the plurality of first-conductivity-type high-concentration regions being positioned deeper than the plurality of second second-conductivity-type high-concentration regions and adjacent to the plurality of second second-conductivity-type high-concentration regions in the depth direction, the plurality of first-conductivity-type high-concentration regions having an impurity concentration higher than the impurity concentration of the plurality of first first-conductivity-type regions.

In the embodiment, the each of the plurality of first second-conductivity-type high-concentration regions has an upper edge, and an interface between the each of the plurality of second second-conductivity-type high-concentration regions and an adjacent one of the plurality of first-conductivity-type high-concentration regions is formed at a position shallower than the upper edge of the each of the plurality of first second-conductivity-type high-concentration regions.

In the embodiment, a distance from the each of the plurality of first second-conductivity-type high-concentration regions to an adjacent one of the plurality of second second-conductivity-type high-concentration regions is at most 1.1 μm in the direction parallel to the surface of the second semiconductor layer.

Objects, features, and advantages of the present invention are specifically set forth in or will become apparent from the following detailed description of the invention when read in conjunction with the accompanying drawings.

DESCRIPTION OF EMBODIMENTS

Figure 13:
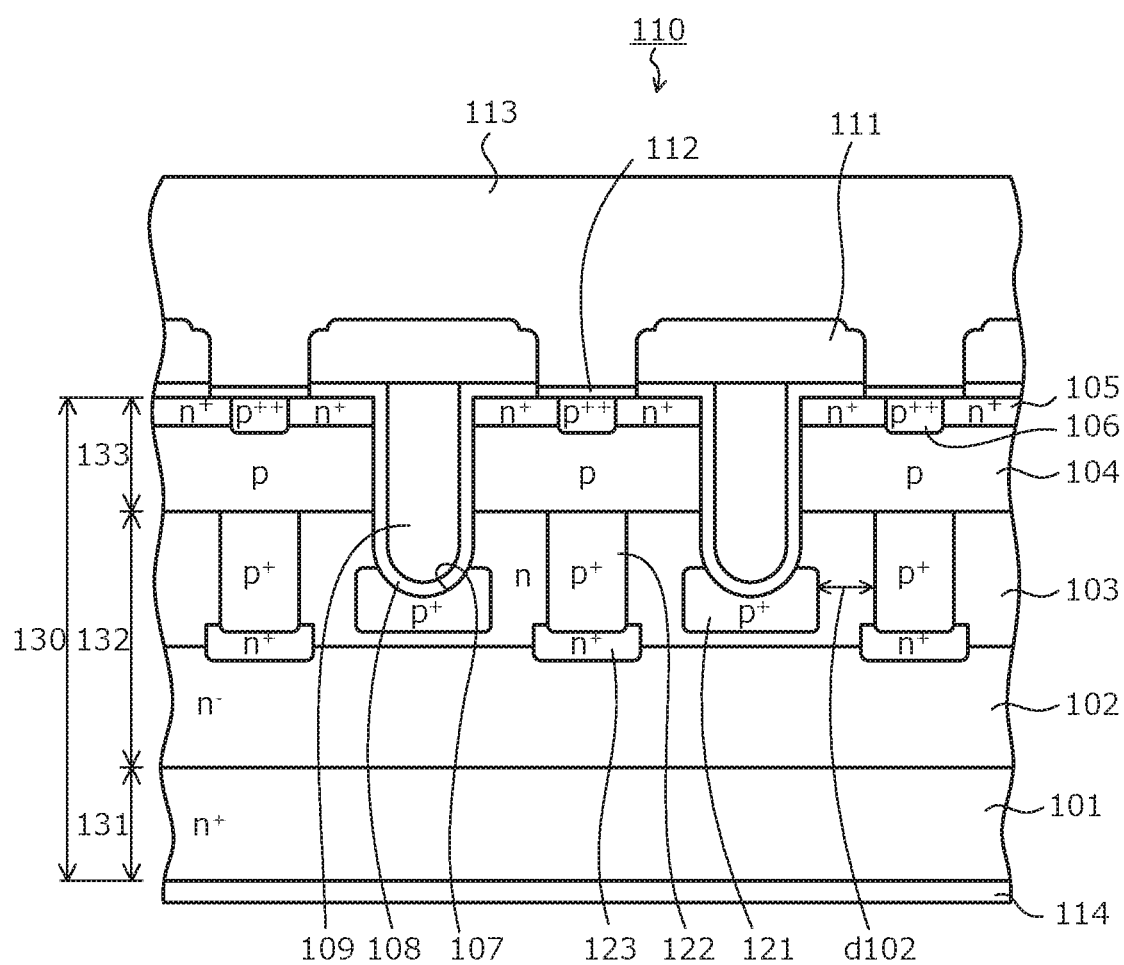
FIG. 13 is a cross-sectional view of a structure of a conventional silicon carbide semiconductor device
Figure 14:
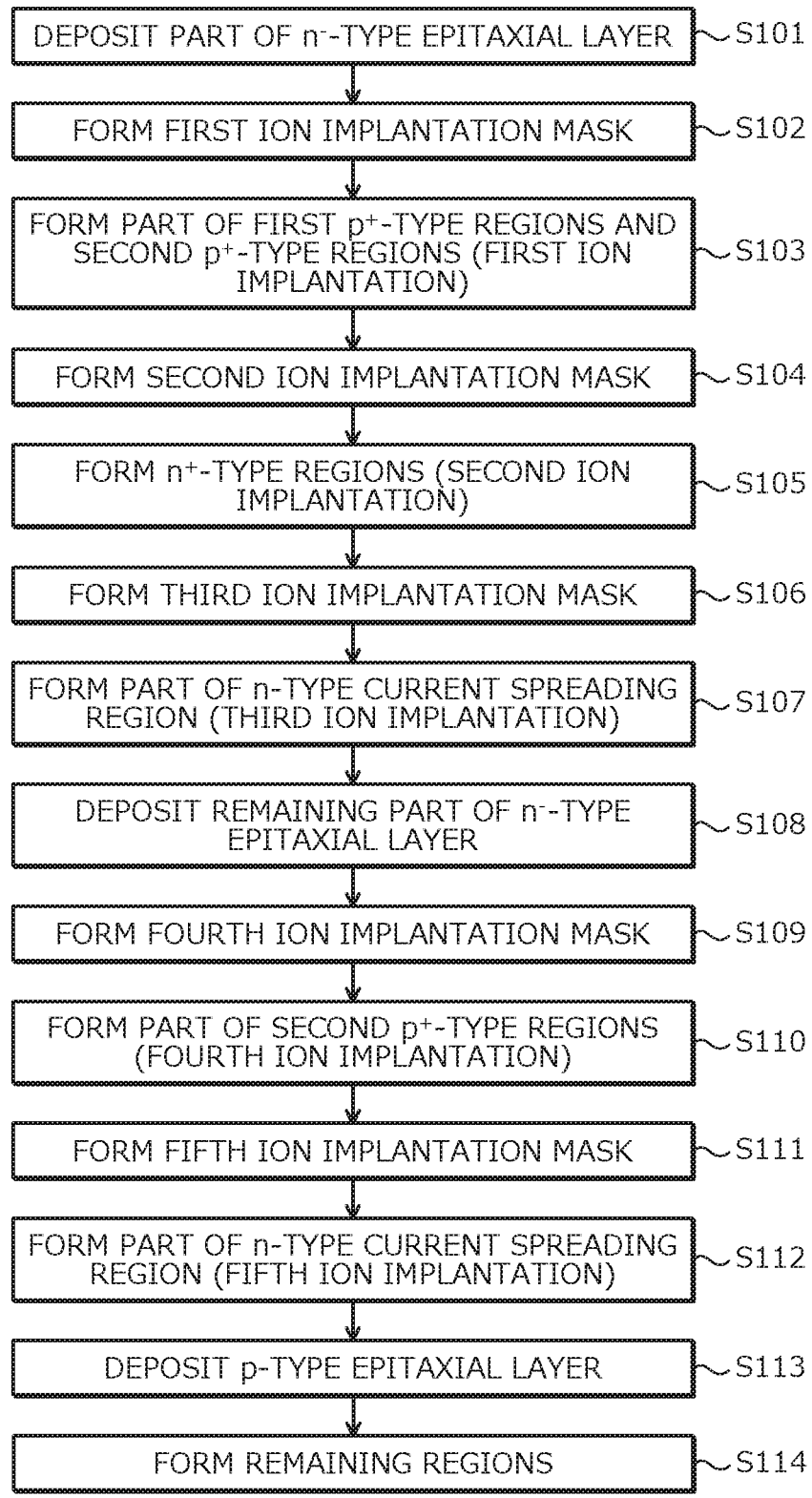
FIG. 14 is a flowchart of an outline of a method of manufacturing the conventional silicon carbide semiconductor device.
Figure 15:
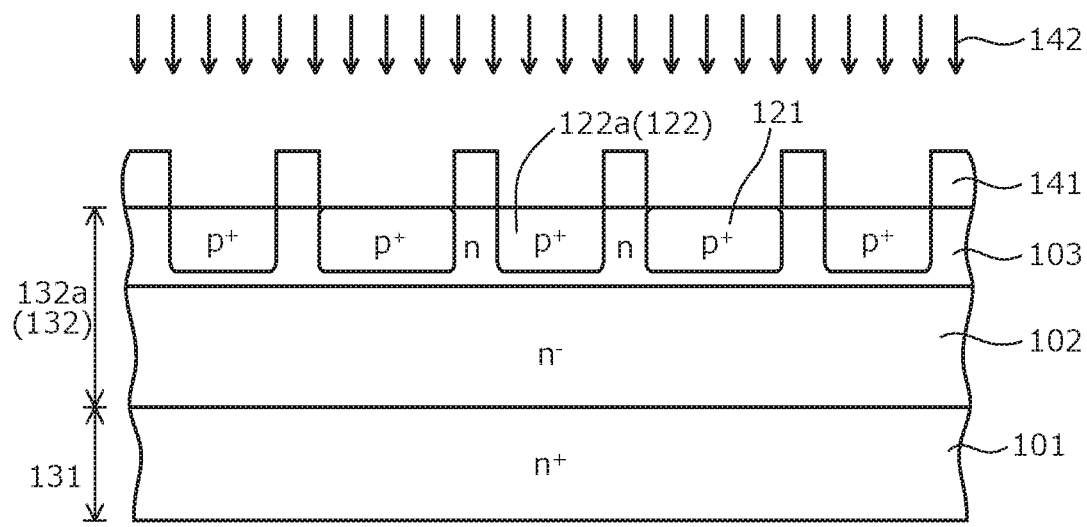
FIG. 15 is a cross-sectional view depicting a state of the conventional silicon carbide semiconductor device during manufacture.
Figure 16:
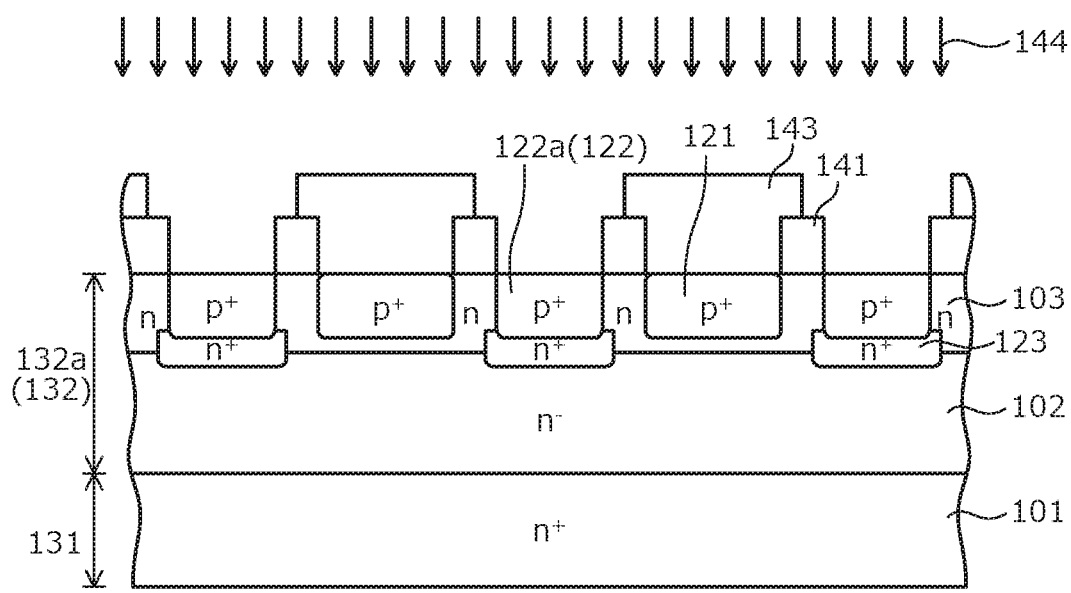
FIG. 16 is a cross-sectional view depicting a state of the conventional silicon carbide semiconductor device during manufacture.
Figure 17:
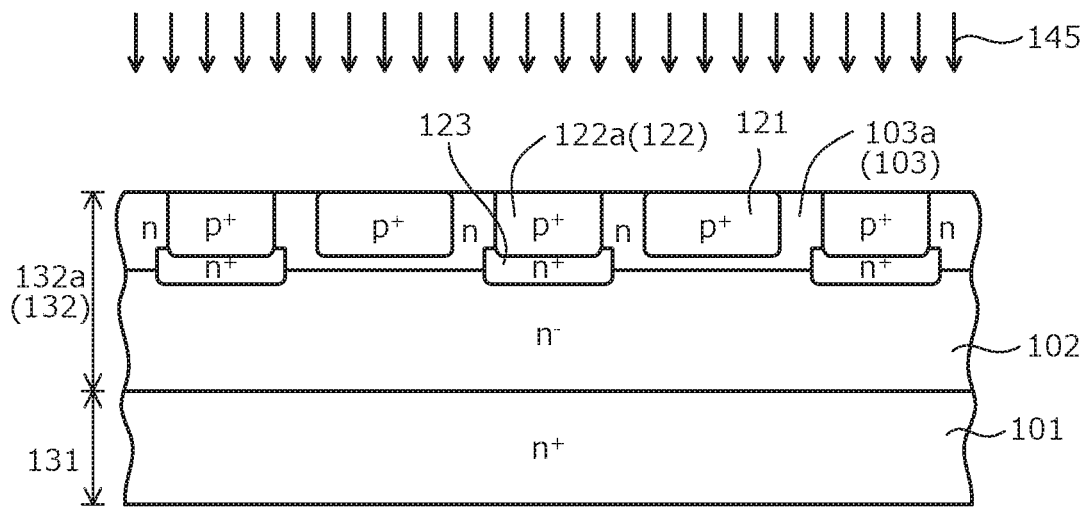
FIG. 17 is a cross-sectional view depicting a state of the conventional silicon carbide semiconductor device during manufacture.
Figure 18:
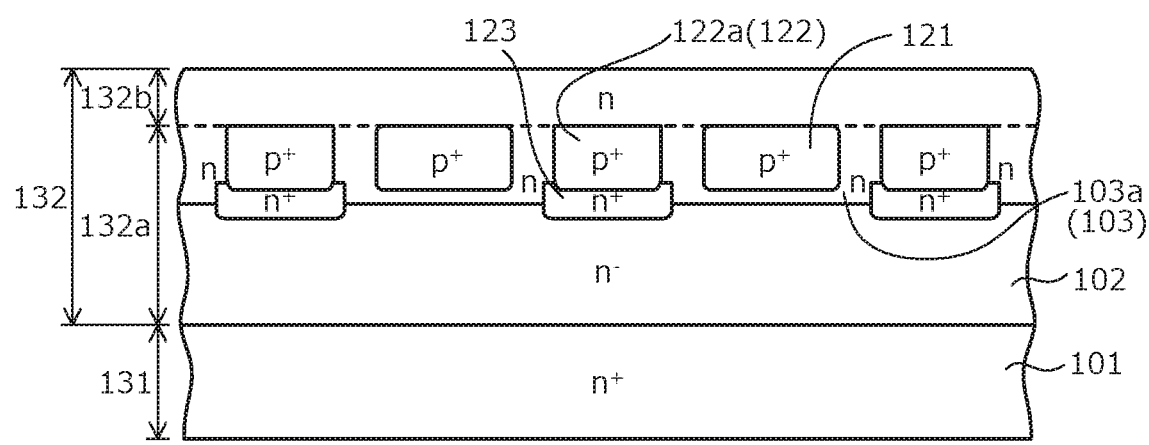
FIG. 18 is a cross-sectional view depicting a state of the conventional silicon carbide semiconductor device during manufacture.
Figure 19:
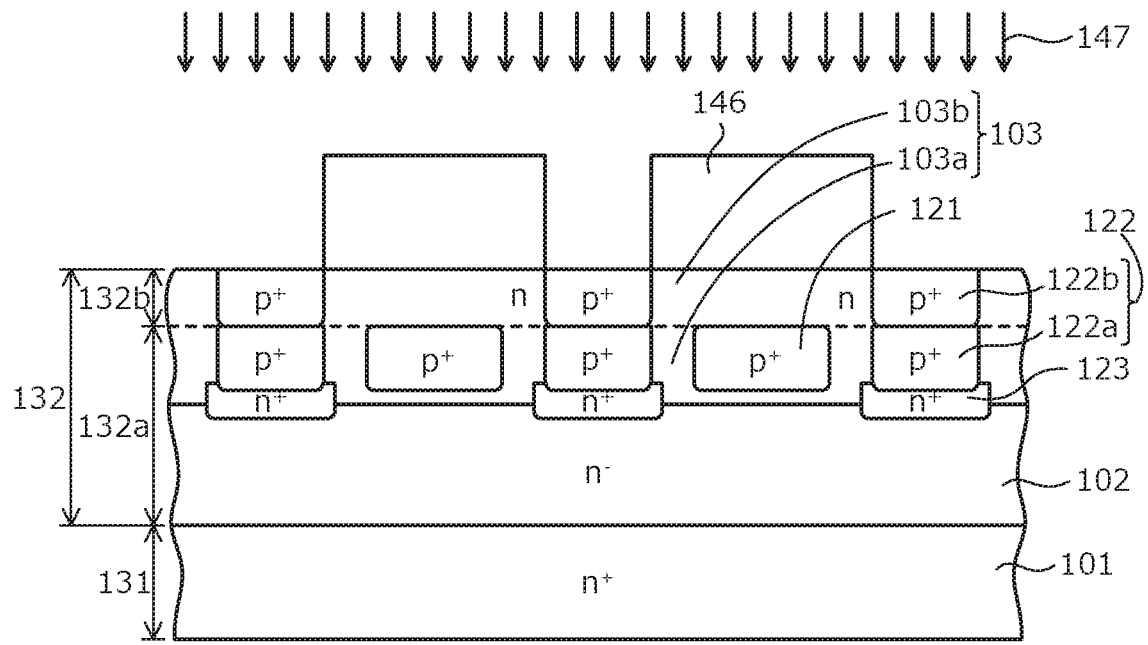
FIG. 19 is a cross-sectional view depicting a state of the conventional silicon carbide semiconductor device during manufacture.
Figure 20:
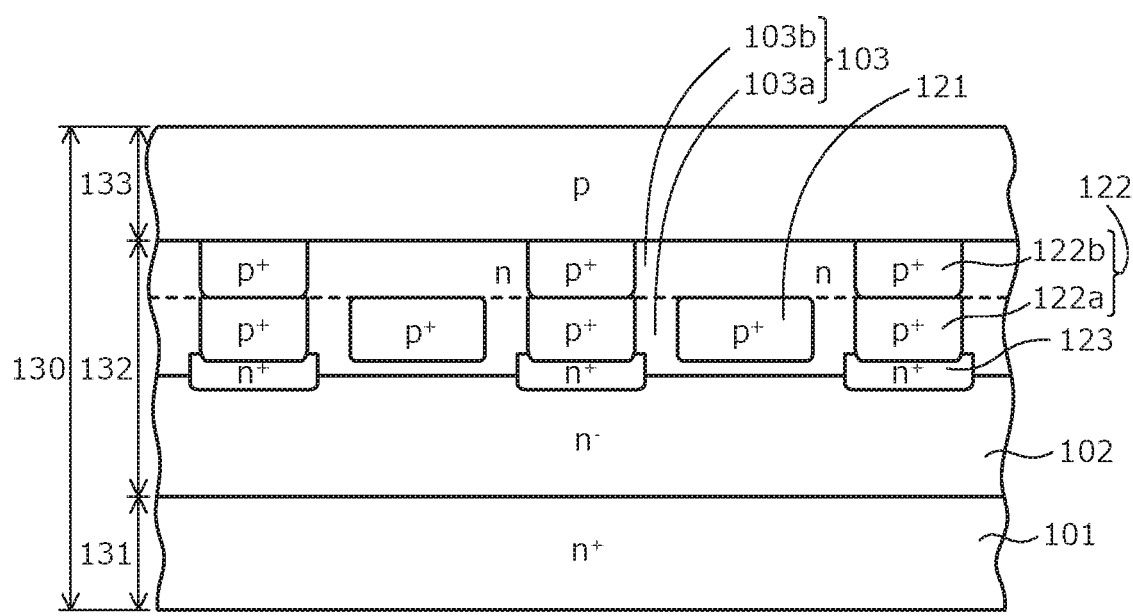
FIG. 20 is a cross-sectional view depicting a state of the conventional silicon carbide semiconductor device during manufacture.

First, problems associated with the conventional techniques will be discussed. In the described conventional silicon carbide semiconductor device 110 depicted in FIG. 13, as compared to the MOSFET described in International Publication No. WO 2017/064949, Japanese Laid-Open Patent Publication No. 2017-139499, and Japanese Patent No. 6115678, the occurrence of avalanche breakdown at the bottoms of the trenches 107 may be suppressed by the $n^+$-type regions 123 provided directly beneath the second $p^+$-type regions 122 and reliability may be enhanced. Nonetheless, a problem arises in that a photolithography process for forming the ion implantation mask used in the formation of the $n^+$-type regions 123 is necessary and therefore, variations in characteristics due to shifts in alignment (positioning) occur and cost also increases due to the increases in the number of processes.

Embodiments of a silicon carbide semiconductor device and a method of manufacturing a silicon carbide semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described.

Figure 1:
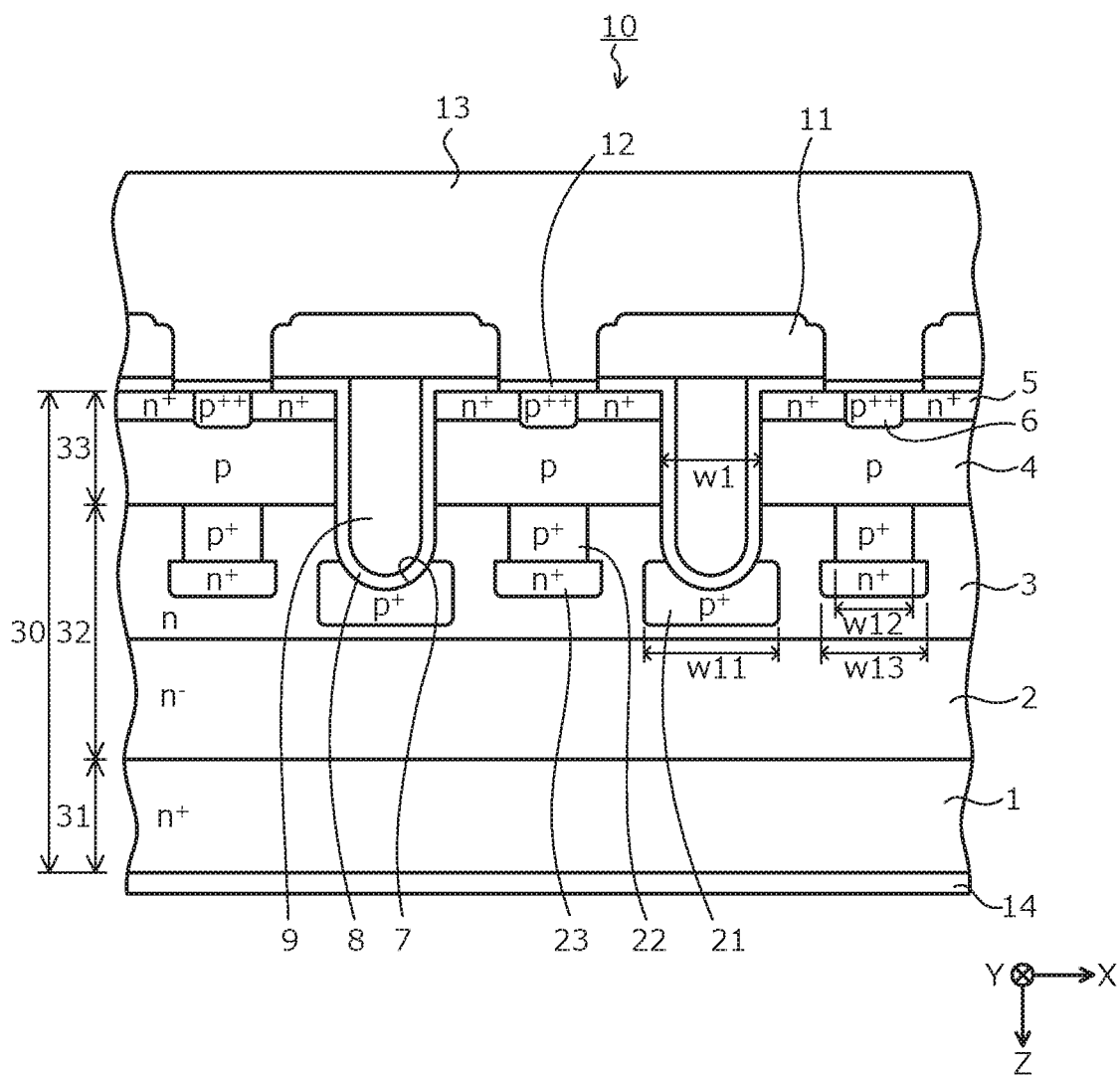
FIG. 1 is a cross-sectional view of a structure of a silicon carbide semiconductor device according to a first embodiment.
Figure 2:
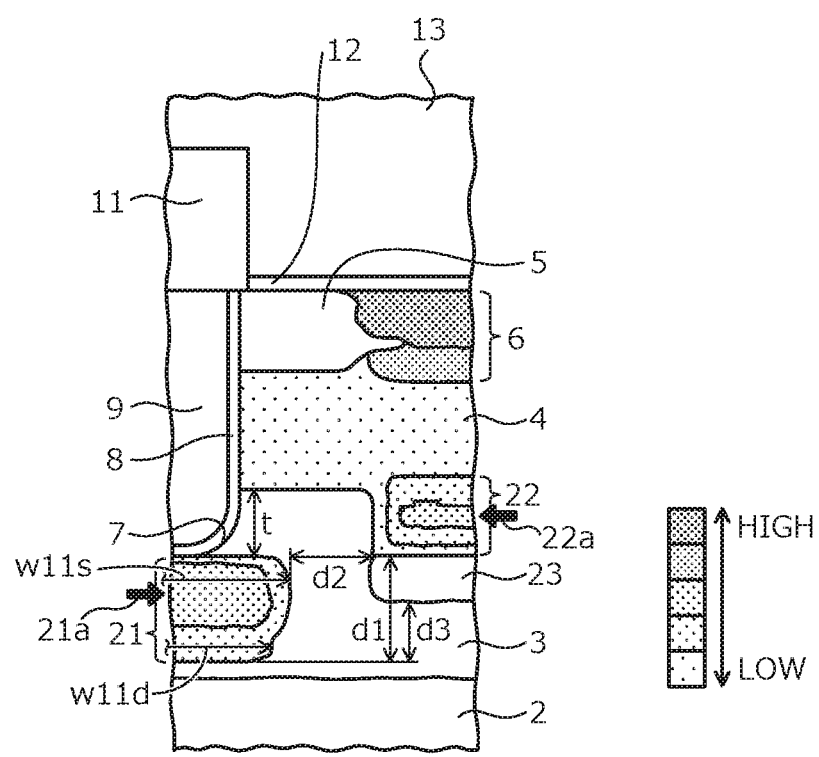
FIG. 2 is an enlarged view of a part of the cross-section depicted in FIG. 1.

A structure of a silicon carbide (SiC) semiconductor device according to a first embodiment will be described. FIG. 1 is a cross-sectional view of the structure of the silicon carbide semiconductor device according to the first embodiment. In FIG. 1, a part of an active region is depicted and an edge termination region that surrounds a periphery of the active region is not depicted (similarly in FIG. 10). FIG. 2 is an enlarged view of a part of the cross-section depicted in FIG. 1. FIG. 2 depicts a part from a center of a trench 7 to a center of a mesa region (similarly in FIG. 11).

Further, in FIG. 2, impurity concentration distributions in p-type semiconductor regions (a p-type base region 4, a $p^{++}$-type contact region 6, and first and second $p^+$-type regions 21, 22) disposed in the mesa region are indicated by different types of hatching. In a p-type impurity concentration legend on a right side of FIG. 2, hatched regions are arranged sequentially along a vertical direction in descending order of p-type impurity concentration, from an uppermost hatched region having a highest p-type impurity concentration (similarly in FIG. 11).

The active region is a region through which current flows when an element (herein, the MOSFET) is ON and a region in which plural unit cells (constituent units of the element) of the element are disposed adjacent to one another along a first direction X that is parallel to a front surface of a semiconductor substrate 30. The edge termination region is a region between the active region and an end (chip end) of the semiconductor substrate 30 and is a region for mitigating electric field at a front side of the semiconductor substrate 30 and sustaining breakdown voltage (withstand voltage).

The breakdown voltage is a voltage limit at which leak current does not increase excessively and no errant operation or destruction of the element occurs. In the edge termination region, a voltage withstanding structure such as a field limiting ring (FLR), a mesa structure, a junction termination extension (JTE) structure, a field plate (FP), or the like is disposed.

A silicon carbide semiconductor device 10 according to the first embodiment depicted in FIGS. 1 and 2 is a vertical MOSFET having a general trench-gate-type MOS gate at the front side of the semiconductor substrate 30 that contains silicon carbide, the silicon carbide semiconductor device 10 having first $p^+$-type regions (first second-conductivity-type high-concentration regions) 21 facing bottoms of trenches 7 in a depth direction Z, and second $p^+$-type regions (second second-conductivity-type high-concentration regions) 22 and $n^+$-type regions (first-conductivity-type high-concentration regions) 23 facing the $p^{++}$-type contact regions 6 in the depth direction Z.

The semiconductor substrate 30 is an epitaxial substrate in which an n-type epitaxial layer 32 and a p-type epitaxial layer 33 that form an $n^-$-type drift region (first semiconductor region) 2 and a p-type base region (second semiconductor region) 4, respectively, are sequentially stacked on a front surface of an $n^+$-type starting substrate 31 that forms an $n^+$-type drain region (fifth semiconductor region) 1. The MOS gate structure is configured by the p-type base region 4, $n^+$-type source regions (third semiconductor regions) 5, the $p^{++}$-type contact regions 6, the trenches 7, a gate insulating film 8, and gate electrodes 9.

The p-type base region 4 is provided between the front surface (main surface including the p-type epitaxial layer 33) of the semiconductor substrate 30 and the $n^-$-type drift region 2. The p-type base region 4 is in contact with the gate insulating film 8 at sidewalls of the trenches 7. Between the p-type base region 4 and the $n^-$-type drift region 2, n-type regions (n-type current spreading regions (fourth semiconductor regions) 3 that form a current spreading layer (CSL) that reduces carrier spreading resistance are provided in contact with the p-type base region 4 and the $n^-$-type drift region 2.

The n-type current spreading regions 3 are provided adjacent to and facing the gate insulating film 8, at the sidewalls of the trenches 7. The n-type current spreading regions 3 are each disposed between one of the first $p^+$-type regions 21 described hereinafter and one each of the second $p^+$-type regions 22 and the $n^+$-type regions 23, each has an n-type impurity concentration of a JFET region between one of the first $p^+$-type regions 21 and one each of the second $p^+$-type regions 22 and the $n^+$-type regions 23 set to be higher than that of the $n^-$-type drift region 2, and n-type current spreading regions 3 have a function of lowering the ON resistance. The first and the second $p^+$-type regions 21, 22, and the $n^+$-type regions 23 will be described hereinafter.

The $n^+$-type source regions 5 and the $p^{++}$-type contact regions 6 are selectively provided in contact with the p-type base region 4, between the front surface of the semiconductor substrate 30 and the p-type base region 4. The $n^+$-type source regions 5 and the $p^{++}$-type contact regions 6 are exposed at the front surface of the semiconductor substrate 30, between (mesa region) adjacent trenches 7 of the trenches 7. The $n^+$-type source regions 5 and the $p^{++}$-type contact regions 6 are disposed adjacent to one another along the first direction X.

The $p^{++}$-type contact regions 6 are disposed at positions further from the trenches 7 than are the $n^+$-type source regions 5. The $p^{++}$-type contact regions 6, for example, are disposed at centers of the mesa regions along the first direction X. The $p^{++}$-type contact regions 6 may be omitted. When the $p^{++}$-type contact regions 6 are omitted, instead of the $p^{++}$-type contact regions 6, the p-type base region 4 reaches the front surface of the semiconductor substrate 30.

The trenches 7 each penetrates through the $n^+$-type source regions 5 and the p-type base region 4, and reaches the n-type current spreading regions 3, and terminates in the first $p^+$-type regions 21. The trenches 7 extend, forming a striped pattern along a second direction Y that is parallel the front surface of the semiconductor substrate 30 and orthogonal to the first direction X. While not depicted, the p-type base region 4, the $n^+$-type source regions 5, and the $p^{++}$-type contact regions 6 are disposed in a linear shape that extends along the second direction Y that is parallel to the trenches 7.

Each of the trenches 7 has sidewalls that are substantially orthogonal to the front surface of the semiconductor substrate 30, and an arc-shaped bottom that protrudes toward a drain side (side having the $n^+$-type drain region 1). Parts (hereinafter, bottom corner parts) of the trenches 7 where the sidewalls and the bottom are connected form arcs that are continuous with the arc-shaped bottoms of the trenches 7. The bottoms of the trenches 7 are positioned in the first $p^+$-type regions 21, respectively. The bottom corner parts of the trenches 7 are positioned in the n-type current spreading regions 3 or in the first $p^+$-type regions 21.

The gate electrodes 9 are provided in the trenches 7 via the gate insulating film 8. An insulating film 11 is provided at an entire area of the front surface of the semiconductor substrate 30. In the insulating film 11, contact holes that penetrate through the insulating film 11 in the depth direction Z and reach the semiconductor substrate 30 are provided. In contact holes, the $n^-$-type source regions 5 and the $p^{++}$-type contact regions 6 are exposed.

A source electrode (first electrode) 13 is provided at an entire area of the front surface of the semiconductor substrate 30 in the active region, and is electrically connected to the $n^+$-type source regions 5 and the $p^{++}$-type contact regions 6 in the contact holes. Reference numeral 12 is a metal film (hereinafter, ohmic electrode (first electrode)) that is in ohmic contact with the $n^+$-type source regions 5 and the $p^{++}$-type contact regions 6 and that electrically connects the source electrode 13 with the $n^+$-type source regions 5 and the $p^{++}$-type contact regions 6.

In a case where the $p^{++}$-type contact regions 6 are omitted, the source electrode 13 is electrically connected to the p-type base region 4 and the $n^+$-type source regions 5 via the ohmic electrode 12. At an entire area of a back surface (main surface having the $n^+$-type starting substrate 31 (back surface of the $n^+$-type starting substrate 31)) of the semiconductor substrate 30, a drain electrode (second electrode) 14 is provided. The drain electrode 14 is in contact with the n+-type drain region 1 and is electrically connected to the n−-type drain region 1.

Next, the first and the second p+-type regions 21, 22 and the n+-type regions 23 will be described. The first p+-type regions 21 are provided directly beneath (drain side) the trenches 7, separate from the p-type base region 4 and facing the bottoms and the bottom corner parts of the trenches 7 in the depth direction Z. Each of the first p+-type regions 21 has a width w11 that is at least equal to a width w1 of each of the trenches 7. Further, the first p+-type regions 21 are exposed at the bottoms of the trenches 7 and are in contact with the gate insulating film 8 at the bottoms of the trenches 7. The first p+-type regions 21 may be in contact with the gate insulating film 8 at the bottom corner parts of the trenches 7.

The first p+-type regions 21 face the n-type current spreading regions 3 along the first direction X. The first p+-type regions 21 may be in contact with the n-type current spreading regions 3 along the first direction X. The first p+-type regions 21, excluding parts thereof in contact with the gate insulating film 8, entirely face the n-type current spreading regions 3 or may be in contact therewith. The first p+-type regions 21 may be in contact with the n−-type drift region 2 at drain-side parts (including drain-side edges) of the p+-type regions 21. The first p+-type regions 21 are disposed separate from the n+-type drain region 1.

The first p+-type regions 21, at non-depicted parts thereof, are in direct contact with the second p+-type regions 22 or are electrically connected to the second p+-type regions 22 and fixed at a source electric potential. The first p+-type regions 21, when in direct contact with the second p+-type regions 22, suffice to be in direct contact with the second p+-type regions 22 at positions separate from the p-type base region 4 in the depth direction Z as much as possible. A reason for this is as follows.

When avalanche breakdown occurs near the second p+-type regions 22, current (hereinafter, avalanche current) flows from the p-type base region 4 toward the source electrode 13. When the first p+-type regions 21 are in direct contact with the second p+-type regions 22 at positions near the p-type base region 4, avalanche current flows from the p-type base region 4 into the first p+-type regions 21 and avalanche breakdown may occur near the first p+-type regions 21.

When the first p+-type regions 21 are in direct contact with the second p+-type regions 22, for example, the n+-type regions 23 are selectively disposed and at parts where the n+-type regions 23 are not disposed, the second p+-type regions 22 extend toward the drain side and face the first p+-type regions 21 in the first direction X. The first p+-type regions 21 extend toward the second p+-type regions 22 along the first direction X. Further, parts of the second p+-type regions 22 extending toward the drain side and parts of the first p+-type regions 21 extending along the first direction X suffice to be in direct contact with one another.

In this case, for example, the n+-type regions 23 are scattered at predetermined intervals along the second direction Y. Drain-side edges of the second p+-type regions 22 at the parts free of the n+-type regions 23 terminate closer to the drain side than are source-side edges of the first p+-type regions 21 and closer to a source side than are the drain-side edges of the first p+-type regions 21. For example, a configuration of second p+-type regions 22' (refer to FIGS. 10, 11) of a second embodiment described hereinafter may be applied as the second p+-type regions 22 in the parts that are free of the n+-type regions 23.

Each of the first p+-type regions 21 has a substantially rectangular cross-sectional shape in which all vertices (corner parts) are rounded. The first p+-type regions 21 have drain-side corner parts having a curvature that is greater than a curvature of source-side corner parts of the first p+-type regions 21, and the width w11 (w11d) on the drain side is narrower than the width w11 (w11s) on the source side (FIG. 2). Of the four vertices of the substantially rectangular cross-sectional shape of the first p+-type regions 21, the two vertices on the source side are the source-side corner parts and the two vertices on the drain side are the drain-side corner parts.

Figure 4:
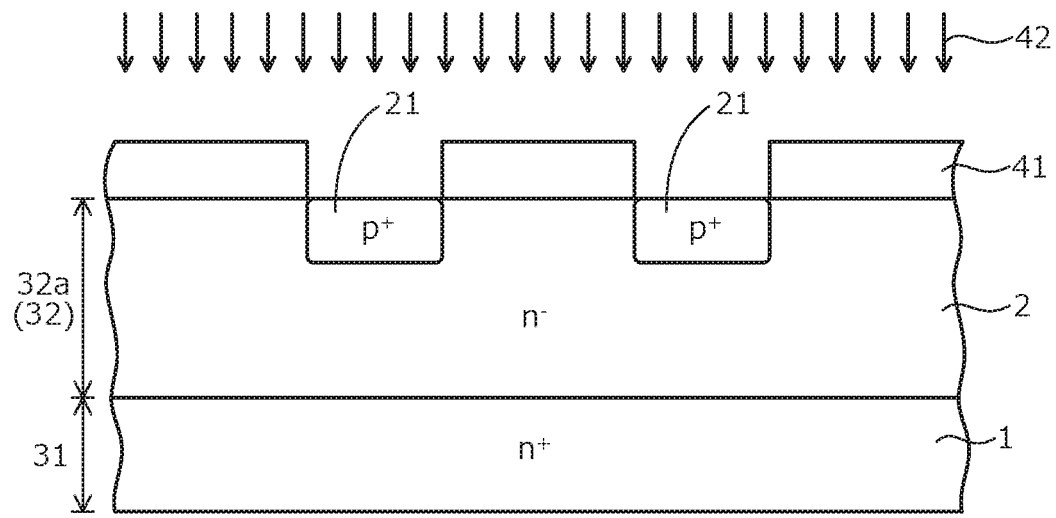
FIG. 4 is a cross-sectional view of the silicon carbide semiconductor device according to the first embodiment during manufacture.

The first p+-type regions 21 are diffusion regions formed by a first ion implantation 42 described hereinafter (refer to FIG. 4). The first p+-type regions 21 have an impurity concentration that exhibits a maximum value (hereinafter, concentration peak) near a depth position of a range of the first ion implantation 42 and decreases with increasing distance from a depth position (height position of a bold arrow indicating the first p+-type regions 21) 21a of the concentration peak, toward the source side and the drain side along the depth direction Z. The depth position 21a of the concentration peak of each of the first p+-type regions 21 is closer to a corresponding trench 7 than to a center of the first p+-type region 21 along the depth direction Z.

In setting the depth position 21a of the concentration peak of each of the first p+-type regions 21 to be closer to a corresponding trench 7 than to the center of the first p+-type region 21 along the depth direction Z, the range of the first ion implantation 42 for forming the first p+-type regions 21 suffices to be variously adjusted. By setting the depth position 21a of the concentration peak of each of the first p+-type regions 21 to be closer to the corresponding trench 7 than to the center of the first p+-type region 21 along the depth direction Z, curvature of a lower edge (drain-side edge) of the first p+-type region 21 may be reduced and electric field concentration may be made less likely to occur.

The second p+-type regions 22 are each provided between (mesa region) a pair of adjacent trenches 7 of the trenches 7, separate from the first p+-type regions 21 and the trenches 7. The second p+-type regions 22 are adjacent to and face the p-type base region 4 along the depth direction Z. The second p+-type regions 22 face the p++-type contact regions 6 along the depth direction Z. The second p+-type regions 22 each faces the sidewalls of the pair adjacent trenches 7 corresponding thereto, across the n-type current spreading regions 3, along the first direction X. Parts of the second p+-type regions 22 other than parts in contact with the p-type base region 4 and the n+-type regions 23 may be in contact with the n-type current spreading regions 3.

The drain-side edges of the second p+-type regions 22 are positioned closer to the source side than are the drain-side edges of the first p+-type regions 21. The drain-side edges of the second p+-type regions 22 may be positioned closer to the source side than is the depth position 21a of the concentration peaks of the first p+-type regions 21. By positioning the drain-side edges of the second p+-type regions 22 closer to the source side than is the depth position 21a of the concentration peaks of the first p+-type regions 21, the concentration peaks of the first p+-type regions 21 and the second p+-type regions 22 do not face one another along the first direction X. Therefore, avalanche breakdown is caused to occur at the second p+-type regions 22 before the first p+-type regions 21, thereby enabling modulation of local electric field in the gate insulating film 8 due to injection of carriers to the gate insulating film 8 at the bottoms of the trenches 7 and further enabling suppression of dielectric breakdown of the gate insulating film 8.

The drain-side edges of the second p$^+$-type regions 22 are interfaces between the second p$^+$-type regions 22 and the n$^+$-type regions 23 described hereinafter, and are flat surfaces substantially parallel to the front surface of the semiconductor substrate 30. The n$^+$-type regions 23 are formed directly beneath the second p$^+$-type regions 22 as described hereinafter, whereby the drain-side edges of the second p$^+$-type regions 22 are flat surfaces substantially parallel to the front surface of the semiconductor substrate 30. The drain-side edges of the second p$^+$-type regions 22 become flat surfaces substantially parallel to the front surface of the semiconductor substrate 30, whereby as compared to a case in which the n$^+$-type regions 23 are not provided directly beneath the second p$^+$-type regions 22 (the second embodiment described hereinafter), the second p$^+$-type regions 22 are shallower and therefore, the ON resistance is reduced.

A distance d1 from the depth position of the drain-side edges of the second p$^+$-type regions 22 to the depth position of the drain-side edges of the first p$^+$-type regions 21 is at least a distance from the p-type base region 4 to the source-side edges of the first p$^+$-type regions 21 in the depth direction Z. The distance from the p-type base region 4 to the source-side edges of the first p$^+$-type regions 21 in the depth direction Z is equal to a thickness t (refer to FIG. 6) of a later-described n$^-$-type epitaxial layer 32b that is deposited by an epitaxial growth method during manufacture and configures the semiconductor substrate 30, and, for example, is about 0.5 μm.

The greater is the distance d1 from the depth position of the drain-side edges of the second p$^+$-type regions 22 to the depth position of the drain-side edges of the first p$^+$-type regions 21, the greater the ON resistance may be reduced. The drain-side edges of the second p$^+$-type regions 22 are positioned closer to the source side than are the source-side edges of the first p$^+$-type regions 21, whereby the ON resistance may be further reduced. A width w12 of the second p$^+$-type regions 22 along the first direction X is uniform in the depth direction Z. A width being uniform means that the width is substantially constant and within a range that includes allowable error due to process variation.

The n-type impurity concentration of the JFET region sandwiched between the first and the second p$^+$-type regions is higher than that of the n$^-$-type drift region due to the n-type current spreading regions 3. A distance (hereinafter, JFET width) d2 from the first p$^+$-type regions 21 to the second p$^+$-type regions 22, along the first direction X, for example, is at most about 1.1 μm. By setting the JFET width d2 to be within the range above, breakdown voltage of at least about 1400V is ensured and the ON resistance may be reduced to at least a same extent as the conventional structure (refer to FIG. 13) in which the drain-side edges of the first and the second p$^+$-type regions 121, 122 are positioned at the same depth.

Figure 7:
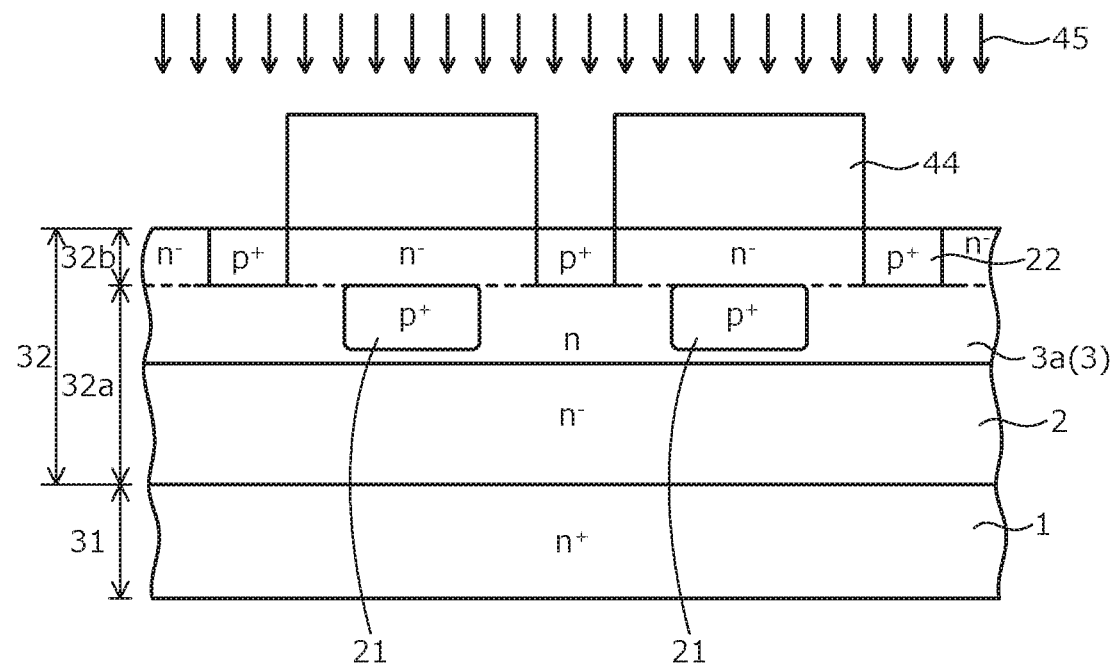
FIG. 7 is a cross-sectional view of the silicon carbide semiconductor device according to the first embodiment during manufacture.

The second p$^+$-type regions 22 are diffused regions formed by a third ion implantation 45 described hereinafter (refer to FIG. 7). The second p$^+$-type regions 22 have an impurity concentration that exhibits a maximum value (the concentration peak) near the depth position of the range of the third ion implantation 45 and decreases with increasing distance from a depth position (height position of a bold arrow indicating the second p$^+$-type regions 22) 22a of the concentration peak, toward the source side and the drain side along the depth direction Z. The depth position 22a of the concentration peak of each of the second p$^+$-type regions 22 is closer to the p-type base region 4 than to a center of the second p$^+$-type region 22 along the depth direction Z.

In setting the depth position 22a of the concentration peaks of the second p$^+$-type regions 22 to be closer to the p-type base region 4 than to the centers of the second p$^+$-type regions 22 along the depth direction Z, the range of the third ion implantation 45 for forming the second p$^+$-type regions 22 suffices to be variously adjusted. By setting the depth position 22a of the concentration peaks of the second p$^+$-type regions 22 to be closer to the p-type base region 4 than to the centers of the second p$^+$-type regions 22 along the depth direction Z, the concentration peaks of the first p$^+$-type regions 21 and the concentration peaks of the second p$^+$-type regions 22 may be set so as to not faces one another along the first direction X. The first and the second p$^+$-type regions 21, 22 have a function of mitigating electric field applied to the bottoms of the trenches 7.

The n$^+$-type regions 23 are each provided in a mesa region, separate from the first p$^+$-type regions 21 and the trenches 7. The n$^+$-type regions 23 are adjacent to and face the second p$^+$-type regions 22 along the depth direction Z. The n$^+$-type regions 23 have a function of making the n-type impurity concentration directly beneath the first p$^+$-type regions 21 to be relatively lower than the n-type impurity concentration directly beneath the second p$^+$-type regions 22 to thereby, suppress occurrence of avalanche breakdown at the bottoms of the trenches 7. The n$^+$-type regions 23 have a thickness of, for example, about 0.2 μm.

The n$^+$-type regions 23 face the n-type current spreading regions 3 along the first direction X. The n$^+$-type regions 23 may be in contact with the n-type current spreading regions 3 in the first direction X. The n$^+$-type regions 23, excluding parts in contact with the second p$^+$-type regions 22, entirely face or may be in contact with the n-type current spreading regions 3. The n$^+$-type regions 23, at the drain-side parts (including the drain-side edges) thereof, may be in contact with the n$^-$-type drift region 2. The n$^+$-type regions 23 are disposed separate from the n$^+$-type drain region 1.

The drain-side edges of the n$^+$-type regions 23 are positioned closer to the drain side in the depth direction Z than are the source-side edges of the first p$^+$-type regions 21. Further, the drain-side edges of the n$^+$-type regions 23 are positioned at a same depth as the drain-side edges of the first p$^+$-type regions 21 or closer to the source side than are the drain-side edges of the first p$^+$-type regions 21. In particular, a distance d3 from a depth position of the drain-side edges of the n$^+$-type regions 23 to a depth position of the drain-side edges of the first p$^+$-type regions 21 is in a range from about 0 μm to 0.5 μm.

The source-side edges (interfaces between the second p$^+$-type regions 22 and the n$^+$-type regions 23) of the n$^+$-type regions 23 may be positioned closer to the source side along the depth direction Z than are the source-side edges of the first p$^+$-type regions 21. A width w13 of the n$^+$-type regions 23 along the first direction X is at least equal to the width w12 of the second p$^+$-type regions 22 along the first direction X. A reason for the width w13 of the n$^+$-type regions 23 along the first direction X being wider than the width w12 of the second p$^+$-type regions 22 along the first direction X is that a lower edge (drain-side edge) of each of the second p$^+$-type regions 22 is, thus, assuredly covered.

The n$^+$-type regions 23 are diffused regions formed by a fourth ion implantation 46 (refer to FIG. 8) described hereinafter. The n$^+$-type regions 23 have an impurity concentration that exhibits a maximum value (the concentration peak) near a depth position (not depicted) of a range of the fourth ion implantation 46. The depth position of the concentration peak of the $n^+$-type regions 23, for example, is near a border between the $n^+$-type regions 23 and the second $p^+$-type regions 22. The impurity concentration of the $n^+$-type regions 23 decreases with increasing distance from the depth position of the concentration peak, toward the drain side in the depth direction Z.

Figure 3:
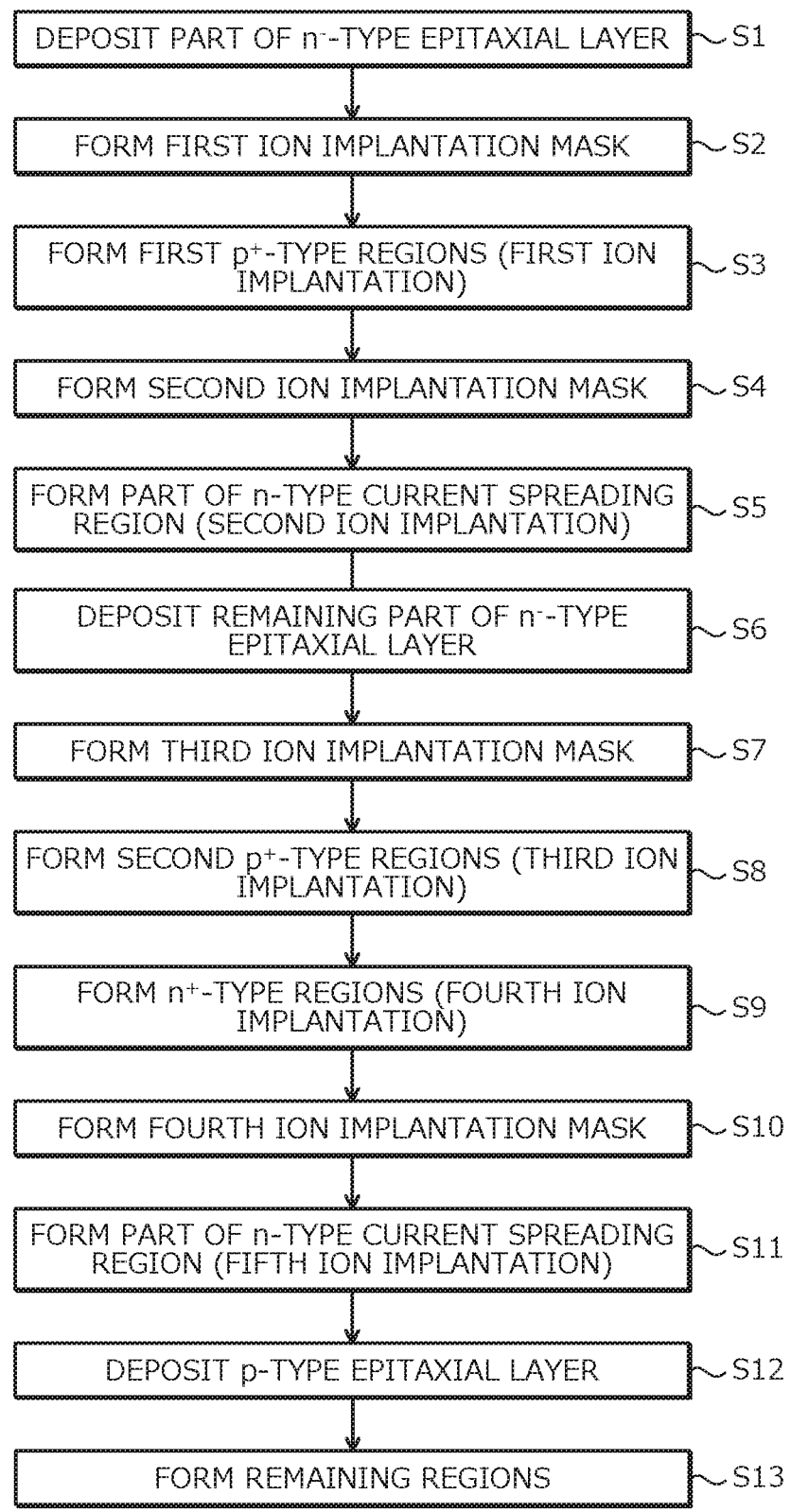
FIG. 3 is a flowchart of an outline of a method of manufacturing the silicon carbide semiconductor device according to the first embodiment.

Next, a method of manufacturing the silicon carbide semiconductor device 10 according to the first embodiment will be described. FIG. 3 is a flowchart of an outline of the method of manufacturing the silicon carbide semiconductor device according to the first embodiment. FIGS. 4, 5, 6, 7, 8, and 9 are cross-sectional views of the silicon carbide semiconductor device according to the first embodiment during manufacture. On the $n^+$-type starting substrate 31 that forms the $n^+$-type drain region 1, of the $n^-$-type epitaxial layer 32, a part (first semiconductor layer) 32a corresponding to a thickness from the $n^+$-type drain region 1 to the source-side edges (upper edges) of the first $p^+$-type regions 21 is deposited (formed) (step S1).

Next, at the surface of the $n^-$-type epitaxial layer 32a, a first ion implantation mask 41 opened at parts corresponding to formation regions of the first $p^+$-type regions 21 is formed (step S2). Next, the first ion implantation 42 of a p-type impurity is performed using the first ion implantation mask 41 as a mask (step S3). In the process at step S3, the first $p^+$-type regions 21 are selectively formed at surface regions of the $n^-$-type epitaxial layer 32a (FIG. 4). Subsequently, the first ion implantation mask 41 is removed.

Figure 5:
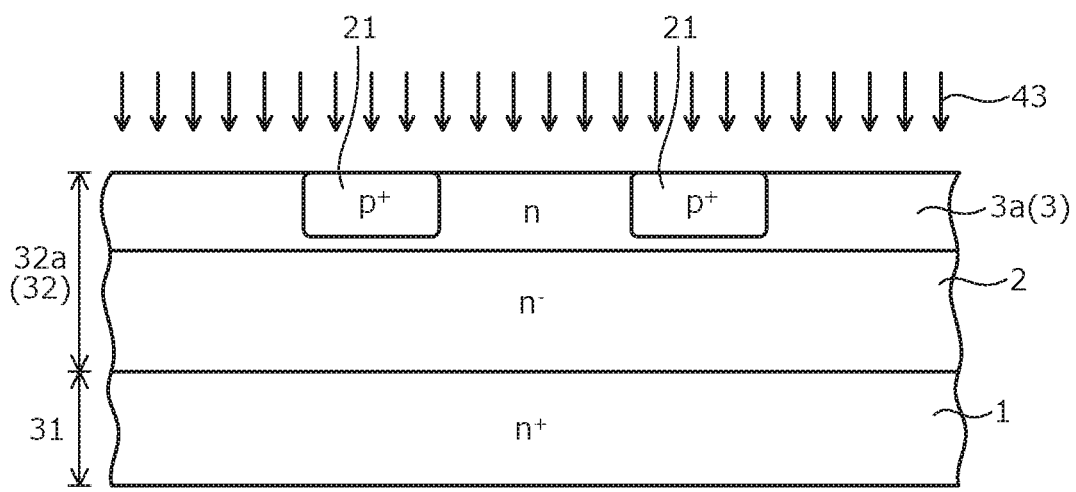
FIG. 5 is a cross-sectional view of the silicon carbide semiconductor device according to the first embodiment during manufacture.

Next, a second ion implantation mask (not depicted) opened at part corresponding to formation regions of the n-type current spreading regions 3 is formed (step S4). Next, a second ion implantation 43 of an n-type impurity is performed using the second ion implantation mask as a mask (step S5). In the process at step S5, between adjacent first $p^+$-type regions 21 of the first $p^+$-type regions 21, an n-type region 3a that is a part of the n-type current spreading regions 3 is formed (FIG. 5). Subsequently, the second ion implantation mask is removed. The processes at steps S2, S3 may be interchanged with the processes at steps S4, S5.

Figure 6:
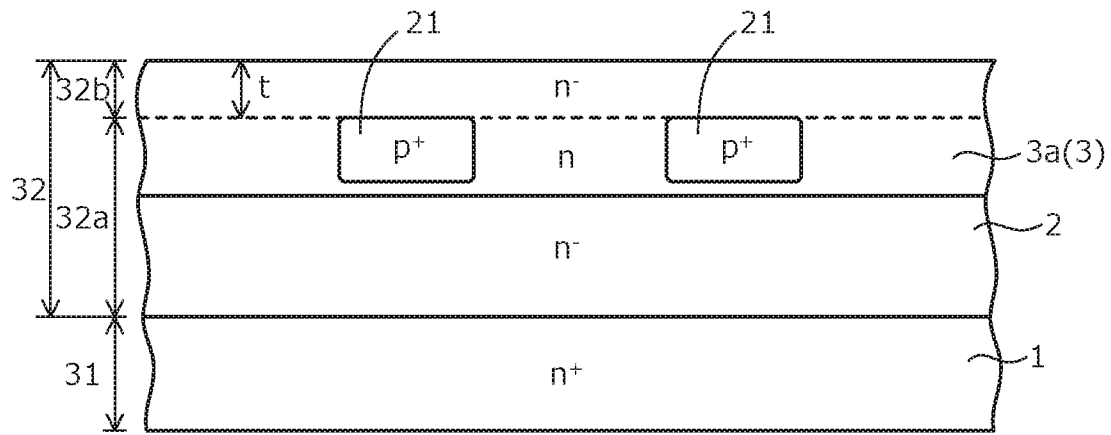
FIG. 6 is a cross-sectional view of the silicon carbide semiconductor device according to the first embodiment during manufacture.

Next, of the $n^-$-type epitaxial layer 32, a part (second semiconductor layer) 32b corresponding to a remaining thickness from the source-side edges of the first $p^+$-type regions 21 to the p-type base region 4 is deposited (step S6). By the process at step S6, the $n^-$-type epitaxial layer 32 has a predetermined thickness between the $n^+$-type drain region 1 and the p-type base region 4 (FIG. 6). Next, at the surface of the $n^-$-type epitaxial layer 32b, a third ion implantation mask 44 opened at parts corresponding to formation regions of the second $p^+$-type regions 22 is formed (step S7).

Next, the third ion implantation 45 of a p-type impurity is performed using the third ion implantation mask 44 as a mask (step S8). In the process at step S8, in the $n^-$-type epitaxial layer 32, the second $p^+$-type regions 22 are formed at a depth shallower than the first $p^+$-type regions 21 (FIG. 7). Here, the drain-side edges of the second $p^+$-type regions 22 (lower edges) have an arc-shape that protrudes toward the drain side (lower side). Next, the fourth ion implantation 46 of an n-type impurity is performed using, as a mask, the third ion implantation mask 44 that is used in the process at step S8 (step S9).

Figure 8:
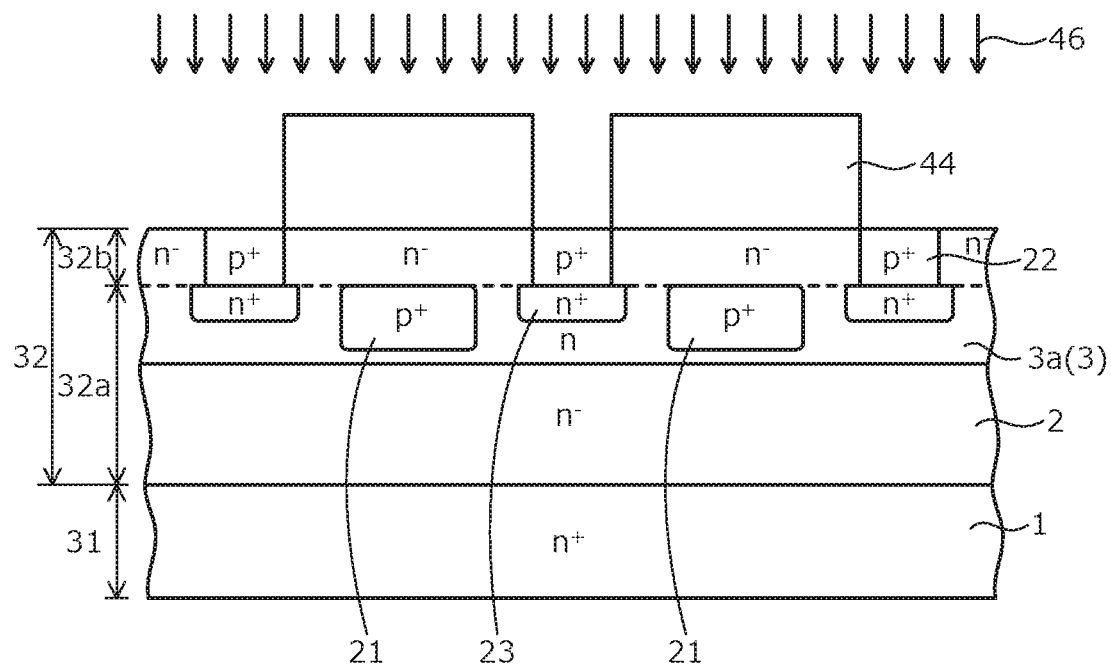
FIG. 8 is a cross-sectional view of the silicon carbide semiconductor device according to the first embodiment during manufacture.

In the process at step S9, in the $n^-$-type epitaxial layer 32, the $n^+$-type regions 23 are formed adjacent to the second $p^+$-type regions 22 in the depth direction Z, at positions deeper than the second $p^+$-type regions 22 (FIG. 8). Here, the arc-shaped part of the drain-side edges of the second $p^+$-type regions 22, the arc-shaped part that protrudes toward the drain side is inverted to an n-type, thereby forming the $n^+$-type regions 23 and a flat surface that is substantially parallel to the front surface of the semiconductor substrate 30. The depth position of the $n^+$-type regions 23 may be variously changed by adjusting the acceleration voltage of the fourth ion implantation 46.

In the process at step S9, the third ion implantation mask 44 that is used in the process (the third ion implantation 45 for forming the second $p^+$-type regions 22) at step S8 is used as is, whereby the $n^+$-type regions 23 may be formed by performing the fourth ion implantation 46 at a higher acceleration voltage than that of the third ion implantation 45. Therefore, directly beneath (lower side) the second $p^+$-type regions 22, the $n^+$-type regions 23 may be formed with positioning accuracy. The process at step S8 and the process at step S9 may be interchanged. Next, the third ion implantation mask 44 is removed.

Next, a fourth ion implantation mask (not depicted) opened at parts corresponding to formation regions of the n-type current spreading regions 3 is formed (step S10). Next, a fifth ion implantation of an n-type impurity is performed using the fourth ion implantation mask as a mask (step S11, not depicted). In the process at step S11, between adjacent second $p^+$-type regions 22 of the second $p^+$-type regions 22, n-type regions 3b that reach the n-type region 3a therebelow are formed, thereby connecting the n-type regions 3a, 3b that are adjacent to one another in the depth direction Z and thus, forming the n-type current spreading regions 3. Next, the fourth ion implantation mask is removed.

Figure 9:
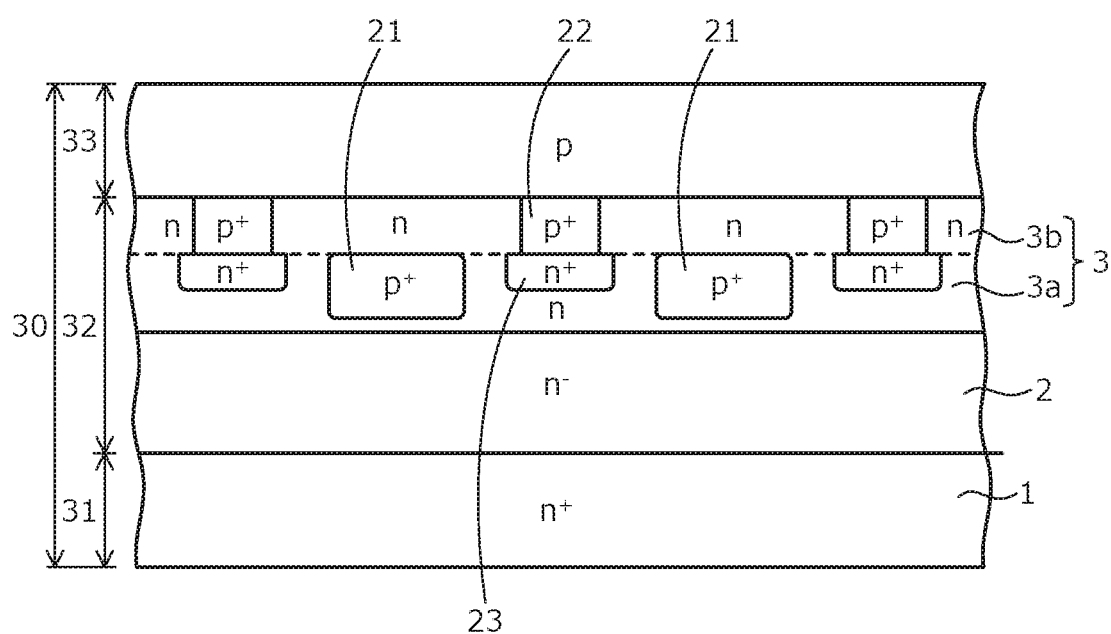
FIG. 9 is a cross-sectional view of the silicon carbide semiconductor device according to the first embodiment during manufacture.

Next, at the surface of the $n^-$-type epitaxial layer 32b, the p-type epitaxial layer (third semiconductor layer) 33 that forms the p-type base region 4 is deposited, whereby the semiconductor substrate (semiconductor wafer) 30 is formed (step S12, FIG. 9). Next, after remaining regions such as the MOS gate structure, the ohmic electrode 12, the source electrode 13, the drain electrode 14 (refer to FIG. 1) are formed (heat treatment for impurity diffusion) (step S13), the semiconductor substrate 30 is diced (cut) into individual chips, whereby the silicon carbide semiconductor device 10 is completed.

As described above, according to the first embodiment, in the mesa regions, the second $p^+$-type regions that have drain-side edges positioned closer to the source side (upper side) than are the drain-side edges of first $p^+$-type regions directly beneath the trenches are provided. As a result, breakdown voltage sufficient to an extent of satisfying a predetermined rated voltage may be ensured and the ON resistance may be reduced. Further, directly beneath the second $p^+$-type regions, the $n^+$-type regions are provided adjacent to the second $p^+$-type regions, thereby enabling the ON resistance to be reduced.

Further, according to the first embodiment, by the $n^+$-type regions directly beneath the second $p^+$-type regions, similarly to the conventional structure, the n-type impurity concentration directly beneath the first $p^+$-type regions may be made lower than the n-type impurity concentration directly beneath the second $p^+$-type regions and therefore, the breakdown voltage of the first $p^+$-type regions may be set to be higher than the breakdown voltage of the second $p^+$-type regions. As a result, the occurrence of avalanche breakdown at the bottoms of the trenches is suppressed, enabling reliability to be enhanced.

Further, according to the first embodiment, the $n^+$-type regions may be formed with positioning accuracy directly beneath the second $p^+$-type regions by using the ion implantation mask that is used in forming the second $p^+$-type regions. Further, formation of an ion implantation mask only for forming the n⁻-type regions is unnecessary. As a result, misalignment may be set to be within an allowable range (within ±0.2 μm) and variation of characteristics due to misalignment may be prevented. Further, cost increases due to increases in the number of processes do not occur.

Figure 10:
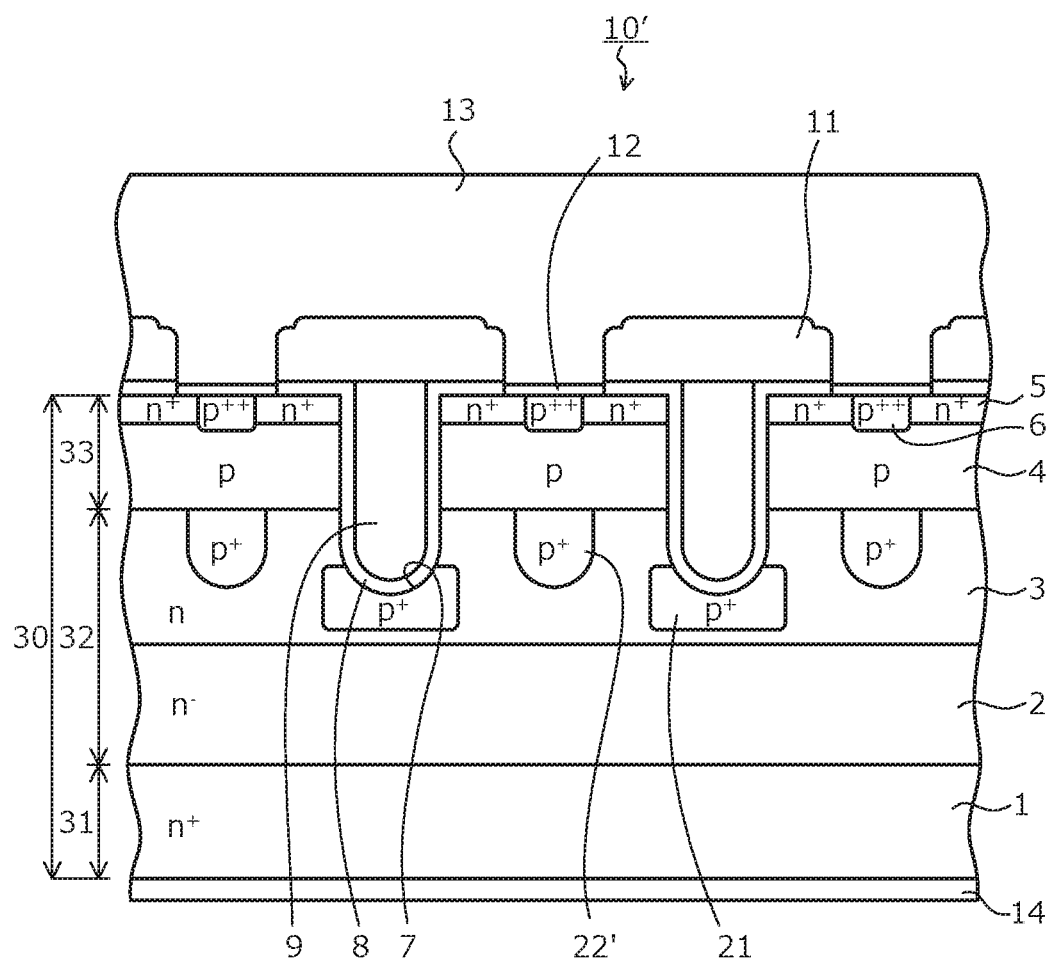
FIG. 10 is a cross-sectional view of a structure of a silicon carbide semiconductor device according to a second embodiment.
Figure 11:
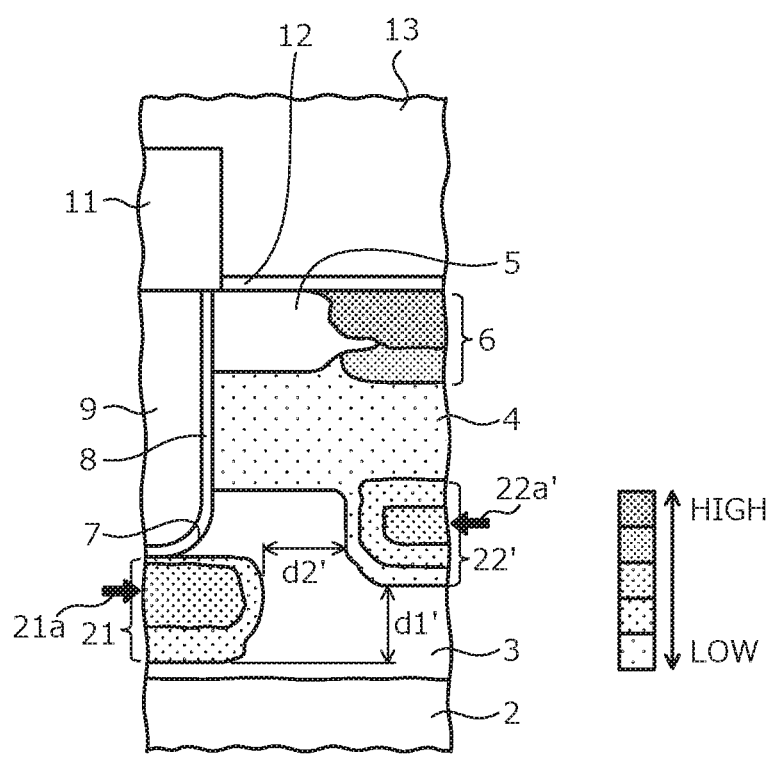
FIG. 11 is an enlarged view of a part of FIG. 10.

Next, a structure of a silicon carbide semiconductor device according to a second embodiment will be described. FIG. 10 is a cross-sectional view of a structure of the silicon carbide semiconductor device according to the second embodiment. FIG. 11 is an enlarged view of a part of FIG. 10. A silicon carbide semiconductor device 10' according to the second embodiment differs from the silicon carbide semiconductor device 10 according to the first embodiment (refer to FIG. 1) in that the n⁺-type regions are not provided directly beneath the second p⁺-type regions 22'.

In the second embodiment, drain-side edges of the second p⁺-type regions 22' terminate closer to the drain side than are the source-side edges of the first p⁺-type regions 21. Further, the drain-side edges of the second p⁺-type regions 22', similarly to the first embodiment, terminate closer to the source side than are the drain-side edges of the first p⁺-type regions 21 and may be positioned closer to the source side than is the depth position 21a of the concentration peaks of the first p⁺-type regions 21 (FIG. 11). A reason for this is similar to that in the first embodiment. The drain-side edges of the second p⁺-type regions 22' have an arc-shape that protrudes toward the drain side.

A distance d1' from a depth position of the drain-side edges of the second p⁺-type regions 22' to a depth position of the drain-side edges of the first p⁺-type regions 21 is shorter than the distance d1 from the depth position of the drain-side edges of the second p⁺-type regions 22 to the depth position of the drain-side edges of the first p⁺-type regions 21 in the first embodiment (refer to FIG. 2) and, for example, is in a range from 0.1 μm to 1.0 μm. A distance (JFET width) d2' from the first p⁺-type regions 21 to the second p⁺-type regions 22', along the first direction X, is a same as the JFET width d2 in the first embodiment (refer to FIG. 2).

A method of manufacturing the silicon carbide semiconductor device 10' according to the second embodiment may be implemented by omitting in the method of manufacturing the silicon carbide semiconductor device 10 according to the first embodiment, the process (the fourth ion implantation 46 for forming the n⁺-type regions directly beneath the second p⁺-type regions 22', refer to FIGS. 3, 8) at step S9. By omitting the process at step S9, the drain-side edges of the second p⁺-type regions 22' are not inverted to an n-type and therefore, the arc-shape that protrudes toward the drain side may be maintained during the process at step S8 (FIGS. 3, 7).

As described above, according to the second embodiment, the n⁺-type regions are not provided directly beneath the second p⁺-type regions, whereby as compared to a case in which the n⁺-type regions are provided directly beneath the second p⁺-type regions, the ON resistance and the breakdown voltage increase; however, effects similar to those of the first embodiment may be obtained. Therefore, this is useful in cases where the breakdown voltage is to be increased even if the ON resistance increases slightly. Further, according to the second embodiment, ion implantation for forming the n⁺-type regions directly beneath the second p⁺-type regions may be omitted and therefore, manufacturing processes may be simplified.

Figure 12:
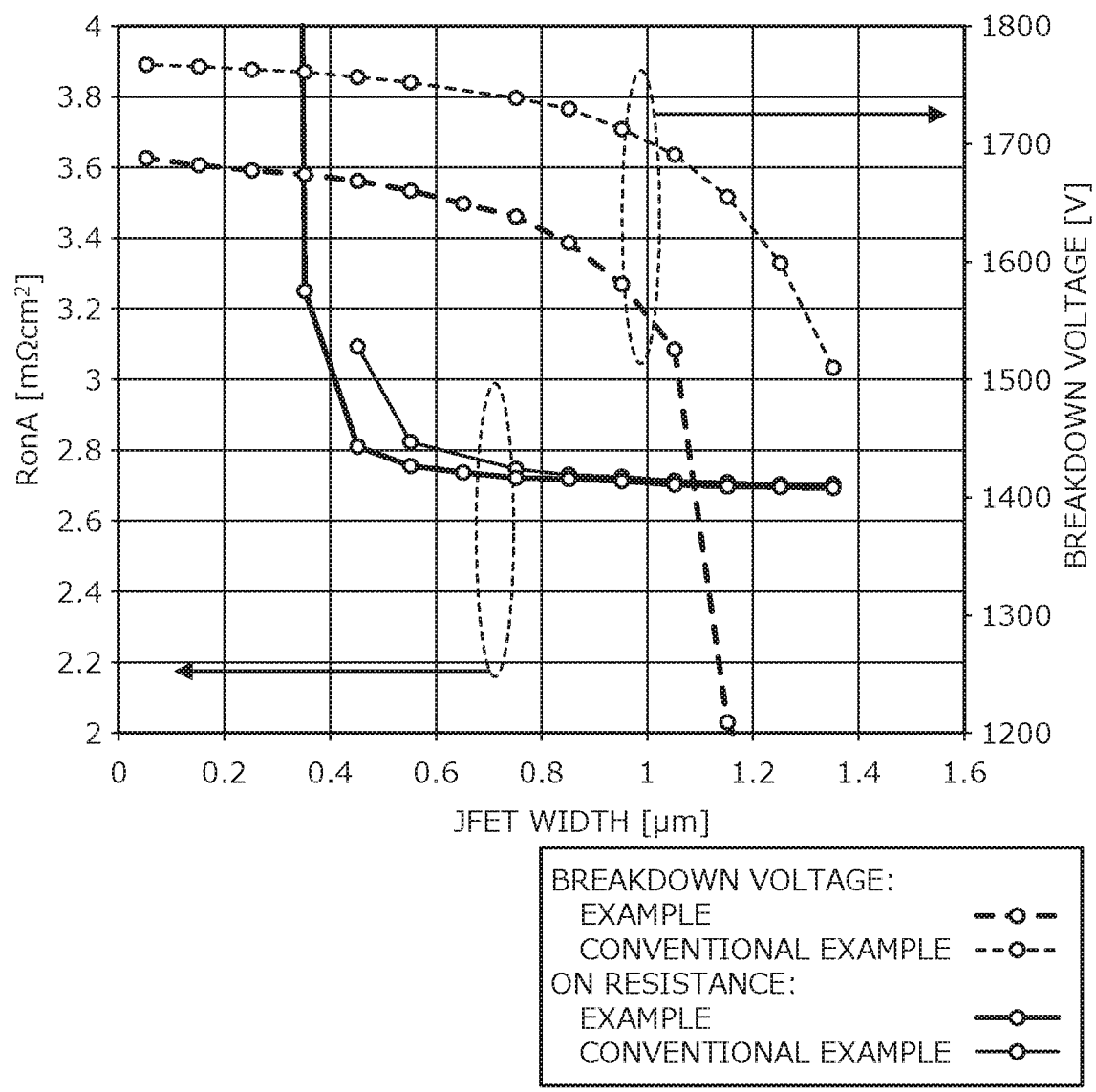
FIG. 12 is a characteristics diagram depicting a relationship between JFET width, breakdown voltage, and ON resistance of an example

Next, a relationship between the JFET width d2 (refer to FIG. 2), breakdown voltage, and ON resistance was verified. FIG. 12 is a characteristics diagram depicting a relationship between JFET width, breakdown voltage, and ON resistance of an example. FIG. 12 shows results of simulation of the breakdown voltage and the ON resistance RonA by variously changing the JFET width d2 in a vertical MOSFET (hereinafter, example) having the described structure of the silicon carbide semiconductor device 10 according to the first embodiment (refer to FIGS. 1, 2).

Further, FIG. 12 shows results of simulation of the breakdown voltage and the ON resistance RonA for a vertical MOSFET (hereinafter, conventional example) having the structure of the conventional silicon carbide semiconductor device 110 (refer to FIG. 13), in which, similarly to the example, a JFET width d102 was variously changed. The conventional example differs from the example in that depth positions of the drain-side edges of the first and the second p⁺-type regions 121, 122 are the same.

From the results depicted in FIG. 12, it was confirmed that while the breakdown voltage of the example decreased more than that of the conventional example, sufficient breakdown voltage (for example, at least 1200V) could be secured even though the JFET width d2 was smaller due to size reductions. For example, when the JFET width d2 is at most 1.1 μm, breakdown voltage of at least 1400V may be secured, enabling ON resistance that is at most about equal to that of the conventional example to be obtained. Therefore, the example is useful in a case, for example, where the JFET width d2 is assumed to be at most 1.1 μm and the rated breakdown voltage is assumed to be 1200V.

While not depicted, for a vertical MOSFET having the described structure of the silicon carbide semiconductor device 10' according to the second embodiment (refer to FIGS. 10, 11), it was confirmed that while the ON resistance and the breakdown voltage are both higher than in the example, effects similar to those of the example are obtained.

In the foregoing, the present invention is not limited to the embodiments described above and various modifications are possible within a range not departing from the spirit of the invention. For example, by embedding the source electrode in trenches (hereinafter, contact trenches) formed in the mesa regions of the semiconductor substrate, the structure may be such that contacts (electrical contacts) between the source electrode and the n⁺-type source regions and the p⁺⁺-type contact regions are formed at inner walls of the contact trenches. Further, for example, a resist film may be used or an oxide film may be used for the ion implantation masks for forming the semiconductor regions.

According to the silicon carbide semiconductor device of the described invention, sufficient breakdown voltage to an extent satisfying a predetermined rated voltage may be secured, the ON resistance may be reduced, and the occurrence of avalanche breakdown at the bottoms of the trenches may be suppressed. Further, according to the method of manufacturing a silicon carbide semiconductor device according to the described invention, the process for forming the first-conductivity-type high-concentration regions directly beneath the second second-conductivity-type high-concentration regions may be omitted. Alternatively, a photolithographic process for forming an ion implantation mask used for forming the first-conductivity-type high-concentration regions directly beneath the second second-conductivity-type high-concentration regions may be omitted. As a result, the number processes may be reduced. In a case in which the first-conductivity-type high-concentration regions are formed, variation in characteristics due to misalignment may be prevented.

The silicon carbide semiconductor device and the method of manufacturing a silicon carbide semiconductor device according to the present invention achieve an effect in that reliability may be enhanced and increases in cost may be prevented.

As described above, the silicon carbide semiconductor device and the method of manufacturing a silicon carbide semiconductor device according to the present invention are useful for power semiconductor devices used in power converting equipment and power supply devices such in various types of industrial machines.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A silicon carbide semiconductor device, comprising:
   a semiconductor substrate containing silicon carbide, having a first main surface and a second main surface opposite to each other;
   a first semiconductor region of a first conductivity type, provided in the semiconductor substrate;
   a second semiconductor region of a second conductivity type, provided between the first main surface of the semiconductor substrate and the first semiconductor region;
   a plurality of third semiconductor regions of the first conductivity type, selectively provided between the first main surface of the semiconductor substrate and the second semiconductor region;
   a plurality of fourth semiconductor regions of the first conductivity type, provided between the first semiconductor region and the second semiconductor region, impurity concentrations of the plurality of the fourth semiconductor regions higher than an impurity concentration of the first semiconductor region;
   a plurality of trenches each penetrating a corresponding third semiconductor region of the plurality of third semiconductor regions and the second semiconductor region, and reaching the plurality of fourth semiconductor regions;
   a plurality of gate electrodes each provided in a corresponding one of the plurality of trenches via a gate insulating film;
   a fifth semiconductor region of the first conductivity type, provided between the second main surface of the semiconductor substrate and the first semiconductor region, an impurity concentration of the fifth semiconductor region higher than the impurity concentration of the first semiconductor region;
   a plurality of first second-conductivity-type high-concentration regions of the second conductivity type, selectively provided at positions closer to the second main surface than are bottoms of the plurality of trenches, separate from the second semiconductor region and facing the plurality of trenches, respectively, in a depth direction, impurity concentrations of the plurality of first second-conductivity-type high-concentration regions higher than an impurity concentration of the second semiconductor region;
   a plurality of second second-conductivity-type high-concentration regions of the second conductivity type, selectively provided at positions closer to the first main surface than is the plurality of first second-conductivity-type high-concentration regions, separate apart from the plurality of trenches and the plurality of first second-conductivity-type high-concentration regions, the plurality of second second-conductivity-type high-concentration regions being in contact with the second semiconductor region, impurity concentrations of the plurality of second second-conductivity-type high-concentration regions higher than the impurity concentration of the second semiconductor region;
   a plurality of first-conductivity-type high-concentration regions of the first conductivity type, selectively provided in the plurality of fourth semiconductor regions, separate from the plurality of trenches and separate from the plurality of first second-conductivity-type high-concentration regions,
   impurity concentrations of the plurality of first-conductivity-type high-concentration regions higher than the impurity concentrations of the plurality of fourth semiconductor regions of the first conductivity type,
   the plurality of first-conductivity-type high-concentration regions having bottoms facing the second main surface;
   a first electrode electrically connected to the second semiconductor region and the third semiconductor regions; and
   a second electrode electrically connected to the fifth semiconductor region, wherein
   each of the plurality of first second-conductivity-type high-concentration regions has a first edge that faces the second main surface and each of the plurality of second second-conductivity-type high-concentration regions has a second edge that faces the second main surface and that is positioned closer to the first main surface than is the first edge of the each of the plurality of first second-conductivity-type high-concentration regions, and
   the first edge is positioned closer to the second main surface than the bottoms of the plurality of first-conductivity-type high-concentration regions are.

2. The silicon carbide semiconductor device according to claim 1, wherein
   the impurity concentrations of the plurality of first second-conductivity-type high-concentration regions decreases with increasing distance from a concentration peak position, toward the first main surface and the second main surface along the depth direction, the concentration peak position indicating a maximum value of the impurity concentrations of the plurality of first second-conductivity-type high-concentration regions, and
   the second edge of the each of the plurality of second second-conductivity-type high-concentration regions is positioned closer to the first main surface than is the concentration peak position of the plurality of first second-conductivity-type high-concentration regions.

3. The silicon carbide semiconductor device according to claim 1, wherein
   the second edge of the each of the plurality of second second-conductivity-type high-concentration regions has a curved shape protruding toward the second main surface.

4. The silicon carbide semiconductor device according to claim 1, wherein
   the plurality of first-conductivity-type high-concentration regions of the first conductivity type are selectively provided in the plurality of fourth semiconductor regions at positions closer to the second main surface than is the plurality of second second-conductivity-type high-concentration regions in the depth direction, the plurality of first-conductivity-type high-concentration regions facing and being in contact with the plurality of second second-conductivity-type high-concentration regions in the depth direction, impurity concentrations of the plurality of first-conductivity-type high-concentration regions higher than the impurity concentration of the first semiconductor region.

5. The silicon carbide semiconductor device according to claim 4, wherein the each of the plurality of first second-conductivity-type high-concentration regions has a third edge facing the first main surface, and the second edge of the each of the plurality of second second-conductivity-type high-concentration regions is positioned closer to the first main surface than is the third edge of the each of the plurality of first second-conductivity-type high-concentration regions.

6. The silicon carbide semiconductor device according to claim 4, wherein the second edge of the each of the plurality of second second-conductivity-type high-concentration regions is a flat surface parallel to the second main surface.

7. The silicon carbide semiconductor device according to claim 4, wherein the each of the plurality of first second-conductivity-type high-concentration regions has a third edge facing the first main surface and a distance from the second edge of the each of the plurality of second second-conductivity-type high-concentration regions to the first edge of the each of the plurality of first second-conductivity-type high-concentration regions is at least a distance from the second semiconductor region to the third edge of the each of the plurality of first second-conductivity-type high-concentration regions in the depth direction.

8. The silicon carbide semiconductor device according to claim 1, wherein a distance from one of the plurality of first second-conductivity-type high-concentration regions to an adjacent one of the plurality of second second-conductivity-type high-concentration regions in a direction parallel to the first main surface is at most 1.1 µm.

\* \* \* \* \*